(12) United States Patent
Tavallaee et al.

(10) Patent No.: US 11,815,720 B1
(45) Date of Patent: Nov. 14, 2023

(54) WAVEGUIDE HEATING IN LIDAR SYSTEMS

(71) Applicant: SiLC Technologies, Inc., Monrovia, CA (US)

(72) Inventors: Amir Ali Tavallaee, San Francisco, CA (US); Amir Hanjani, Cincinnati, OH (US); Chen Chen, Arcadia, CA (US)

(73) Assignee: SiLC Technologies, Inc., Monrovia, CA (US)

( * ) Notice: Subject to any disclaimer, the term of this patent is extended or adjusted under 35 U.S.C. 154(b) by 395 days.

(21) Appl. No.: 17/152,738

(22) Filed: Jan. 19, 2021

(51) Int. Cl.
*G02B 6/293* (2006.01)
*G02B 6/42* (2006.01)
*G01S 7/481* (2006.01)
*G01S 17/34* (2020.01)

(52) U.S. Cl.
CPC ........ *G02B 6/29395* (2013.01); *G01S 7/4814* (2013.01); *G01S 17/34* (2020.01); *G02B 6/29328* (2013.01); *G02B 6/4215* (2013.01)

(58) Field of Classification Search
CPC ............. G02B 6/4215; G02B 6/29395; G02B 7/4814; G02B 17/34; G02B 6/29328
See application file for complete search history.

(56) References Cited

U.S. PATENT DOCUMENTS

2008/0181550 A1* 7/2008 Earnshaw ............. G02F 1/0147
385/1
2022/0179055 A1* 6/2022 Ferrara ................ G02B 6/4269

* cited by examiner

*Primary Examiner* — Joseph L Williams
(74) *Attorney, Agent, or Firm* — Gavrilovich, Dodd & Lindsey LLP

(57) ABSTRACT

A waveguide heater is configured to heat an optical waveguide. The heater includes multiple heating elements and has one or two conditions selected from a group consisting of a first condition and the second condition. The first condition is the heater including multiple interior connectors that are each included in an interior electrical pathway between a pair of the heating elements where the interior connectors are connected in parallel and provide electrical communication between the heating elements included in the pair. The second condition is multiple exterior connectors that are each included in an exterior electrical pathway between electronics and a first one of the heating elements where the exterior connectors are connected in parallel and provide electrical communication between the electronics and the first heating element. The electronics are configured to apply an electrical bias to the heater. In some instances, the heater in included in a wavelength tuner.

20 Claims, 12 Drawing Sheets

WAVEGUIDE HEATING IN LIDAR SYSTEMS

FIELD

The invention relates to optical devices. In particular, the invention relates to optical waveguide heaters.

BACKGROUND

In a variety of optical systems, it is desirable to tune the wavelength of light output from light sources such as lasers. For instance, it is often desirable to tune the wavelength of light output from LIDAR systems. One method of wavelength tuning includes heating one or more components in a laser cavity. However, these heating approaches have undesirably high energy requirements. As a result, there is a need for a more efficient wavelength tuning mechanism.

SUMMARY

A waveguide heater is configured to heat an optical waveguide. The heater includes multiple heating elements and has one or two conditions selected from a group consisting of a first condition and a second condition. The first condition is that the heater includes multiple interior connectors that each form an interior electrical pathway between a pair of the heating elements where the interior connectors are connected in parallel and provide electrical communication between the heating elements included in the pair. The second condition is that multiple exterior connectors are each included in an exterior electrical pathway between electronics and a first one of the heating elements where the exterior connectors are connected in parallel and provide electrical communication between the electronics and the first heating element and where the electronics are configured to apply an electrical bias to the heater. In some instances, the heater is included in a wavelength tuner.

In one example, the heater is included in a LIDAR system. In some instances, the LIDAR system includes a laser cavity and the heater is configured to change a wavelength of a light signal output from the laser cavity. In some instances, the LIDAR system is configured to output a LIDAR output signal and a direction that the LIDAR output signal travels away from the LIDAR system changes in response to the change in wavelength of the light signal output from the laser cavity.

BRIEF DESCRIPTION OF THE FIGURES

FIG. 10A is a topview of the LIDAR chip.

FIG. 10B is a cross section of the LIDAR chip taken along the line labeled B in FIG. 10A.

FIG. 10C is a cross section of the LIDAR chip taken along the line labeled C in FIG. 10A.

FIG. 11A is a topview of the LIDAR chip.

FIG. 11B is a cross section of the LIDAR chip taken along the line labeled B in FIG. 11A.

FIG. 11C is a cross section of the LIDAR chip taken along the line labeled C in FIG. 11A.

FIG. 12A is a topview of the LIDAR chip.

FIG. 12B is a cross section of the LIDAR chip taken along the line labeled B in FIG. 12A.

FIG. 12C is a cross section of the LIDAR chip taken along the line labeled C in FIG. 12A.

FIG. 13A is a topview of the LIDAR chip.

FIG. 13B is a cross section of the LIDAR chip taken along the line labeled B in FIG. 13A.

FIG. 14A is a cross section of the LIDAR chip taken along the line labeled D in FIG. 11A or FIG. 13A.

FIG. 14B is a cross section of the LIDAR chip taken along the line labeled E in FIG. 11A or FIG. 13A.

DESCRIPTION

A heater is positioned so as to apply heat to a waveguide. The heater includes multiple heating elements that are spaced apart from one another and are in electrical communication with one another. Electronics are configured to drive an electrical current through the heating elements. The electrical connections between the heating elements and also between the heating elements and the electronics are configured such that the electrical current enters each of the heating elements at multiple different locations along the length of the heating element and also exits each heating element at multiple different locations along the length of the heating element. The distribution of electrical current across the heating elements increases the efficiency of the heater.

The heater can be included in a LIDAR system configured to output a LIDAR output signal. The LIDAR system can be configured such that a direction that the LIDAR output signal travels away from the LIDAR system changes in response to changes in the wavelength of the LIDAR output signal. The heater can be configured such that the wavelength of the LIDAR output signal changes in response to changes in the level of heat output from the heater. Additionally, electronics can operate the heater so as to tune the wavelength of the LIDAR output signal. Since the direction of the LIDAR output is a function of the wavelength of the LIDAR output signal, the electronics can tune the heater so as to control the direction that the LIDAR output signal travels away from the LIDAR system. For instance, the electronics can control the direction of the LIDAR output signal so the LIDAR output signal is scanned to multiple different sample regions in a field of view. The electronics can generate LIDAR data (radial velocity and/or distance between a reflecting object and the LIDAR system) for each of the different sample regions. The increased efficiency of the heater provides an efficient method of scanning the LIDAR output signal to different sample regions.

Figure 1:
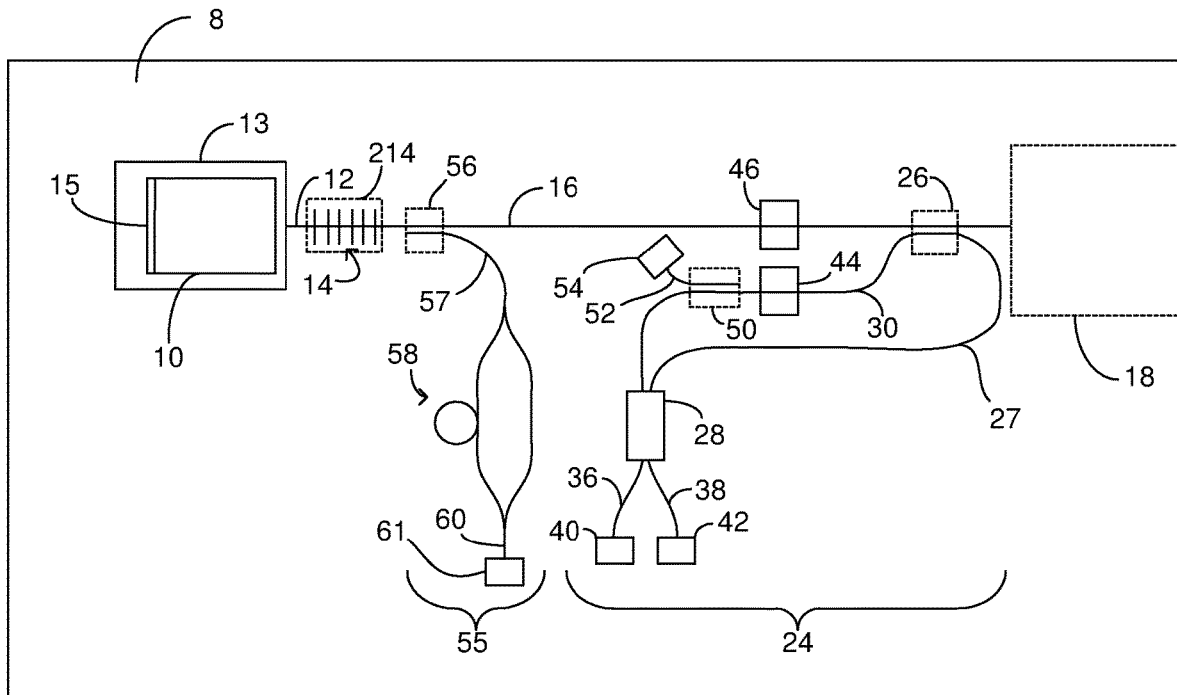
FIG. 1 is a top view of a LIDAR chip.

FIG. 1 is a topview of a LIDAR system that includes a LIDAR chip. The LIDAR chip can be in integrated circuit chip that includes an integrated circuit such as a Photonic Integrated Circuit (PIC) chip that includes a Photonic Integrated Circuit (PIC). The illustrated LIDAR chip includes a laser cavity. The laser cavity includes a light source 10 that can include or consist of a gain medium (not shown) for a laser. The chip also includes a cavity waveguide 12 that receives a light signal from the light source 10. The light source can be positioned in a recess 13 so a facet of the light source is optically aligned with a facet of the cavity waveguide 12 to allow the light source and cavity waveguide 12 to exchange light signals. The cavity waveguide 12 carries the light signal to a partial return device 14. The illustrated partial return device 14 is an optical grating such as a Bragg grating. However, other partial return devices 14 can be used; for instance, mirrors can be used in conjunction with echelle gratings and arrayed waveguide gratings.

The partial return device 14 returns a return portion of the light signal to the cavity waveguide 12 as a return signal. For instance, the cavity waveguide 12 returns the return signal to the light source 10 such that the return portion of the light signal travels through the gain medium. The light source 10 is configured such that at least a portion of the return signal is added to the light signal that is received at the cavity waveguide 12. For instance, the light source 10 can include a highly, fully, or partially reflective device 15 that reflects the return signal received from the gain medium back into the gain medium. As a result, light can resonate between the partial return device 14 and the reflective device 15 so as to form a Distributed Bragg Reflector (DBR) laser cavity. A DBR laser cavity has an inherently narrow-linewidth and a longer coherence length than DFB lasers and accordingly improves performance when an object reflecting the LIDAR output signal from the chip is located further away from the chip.

The partial return device 14 passes a portion of the light signal received from the cavity waveguide 12 to a utility waveguide 16 included on the chip. The portion of the light signal that the utility waveguide 16 receives from the partial return device 14 serves as the output of the laser cavity. The output of the laser cavity serves as an outgoing LIDAR signal on the utility waveguide 16. The utility waveguide 16 terminates at a beam-steering mechanism 18 and carries the outgoing LIDAR signal to the beam-steering mechanism 18.

The beam-steering mechanism 18 can be positioned such that the outgoing LIDAR signal travels through the beam-steering mechanism 18 and exits the chip to serve as a LIDAR output signal. The beam-steering mechanism 18 is configured to tune a direction that the LIDAR output signal travels away from the LIDAR chip.

The LIDAR output signal travels away from the chip and is reflected by objects in the path of the LIDAR signal. The reflected signal travels away from the objects. At least a portion of the reflected signal returns to the beam-steering mechanism 18 and travels through the beam-steering mechanism 18 to be received at the utility waveguide 16. Accordingly, a portion of the reflected signal can enter the utility waveguide 16 through the beam-steering mechanism 18 and serve as a LIDAR input signal guided by the utility waveguide 16.

The chip includes a data branch 24 where the optical signals that are processed for LIDAR data are generated. The data branch includes an optical coupler 26 that moves a portion of the light signals from the utility waveguide 16 into the data branch. For instance, an optical coupler 26 couples a portion of the outgoing LIDAR signal from the utility waveguide 16 onto a reference waveguide 27 as a reference signal. The reference waveguide 27 carries the reference signal to a light-combining component 28.

The optical coupler 26 also couples a portion of the LIDAR input signal from the utility waveguide 16 onto a comparative waveguide 30 as a comparative signal. The comparative signal includes at least a portion of the light from the LIDAR input signal. The comparative signal can exclude light from the reference light signal. The comparative waveguide 30 carries the comparative signal to the light-combining component 28.

The illustrated optical coupler 26 is a result of positioning the utility waveguide 16 sufficiently close to the reference waveguide 27 and the comparative waveguide 30 that light from the utility waveguide 16 is coupled into the reference waveguide 27 and the comparative waveguide 30; however, other signal tapping components can be used to move a portion of the of the light signals from the utility waveguide 16 onto the reference waveguide 27 and the comparative waveguide 30. Examples of suitable signal tapping components include, but are not limited to, y-junctions, multi-mode interference couplers (MMIs), and integrated optical circulators.

The light-combining component 28 combines the comparative signal and the reference signal into a composite signal. The reference signal includes light from the outgoing LIDAR signal. For instance, the reference signal can serve as a sample of the outgoing LIDAR signal. The reference signal can exclude light from the LIDAR output signal and the LIDAR input signal. In contrast, the comparative signal light includes light from the LIDAR input signal. For instance, the comparative signal can serve as a sample of the LIDAR input signal. Accordingly, the comparative signal has been reflected by an object located off of the chip while the LIDAR output signal has not been reflected. When the chip and the reflecting object are moving relative to one another, the comparative signal and the reference signal have different frequencies due to the Doppler effect. As a result, beating occurs between the comparative signal and the reference signal.

The light-combining component 28 also splits the resulting composite sample signal onto a first detector waveguide 36 and a second detector waveguide 38. The first detector waveguide 36 carries a first portion of the composite sample signal to a first light sensor 40 that converts the first portion of the composite sample signal to a first electrical signal. The second detector waveguide 38 carries a second portion of the composite sample signal to a second light sensor 42 that converts the second portion of the composite sample signal to a second electrical signal. Examples of suitable light sensors include germanium photodiodes (PDs), and avalanche photodiodes (APDs).

The light combining component 28, the first light sensor 40 and the second light sensor 42 can be connected as a balanced photodetector that outputs an electrical data signal. For instance, the light combining component 28, the first light sensor 40 and the second light sensor 42 can be connected such that the DC components of the signal photocurrents cancel, improving detection sensitivity. Suitable methods for connecting the first light sensor 40 and the second light sensor 42 as balanced photodetectors include connecting the first light sensor 40 and the second light sensor 42 in series. In one example, the first light sensor 40 and the second light sensor 42 are both avalanche photodiodes connected in series. Balanced photodetection is desirable for detection of small signal fluctuations.

An example of a suitable light-combining component 28 is a Multi-Mode Interference (MMI) device such as a 2×2 MMI device. Other suitable light-combining components 28 include, but are not limited to, adiabatic splitters, and directional coupler. In some instances, the functions of the illustrated light-combining component 28 are performed by more than one optical component or a combination of optical components.

A single light sensor can replace the first light sensor 40 and the second light sensor 42 and can output the data signal. When a single light sensor replaces the first light sensor 40 and the second light sensor 42, the light-combining component 28 need not include light-splitting functionality. As a result, the illustrated light light-combining component 28 can be a 2×1 light-combining component rather than the illustrated 2×1 light-combining component. For instance, the illustrated light light-combining component can be a 2×1 MMI device. In these instances, the chip includes a single detector waveguide that carries the composite sample signal to the light sensor.

The data branch includes a data optical attenuator 44 positioned along the comparative waveguide 30 such that the data optical attenuator 44 can be operated so as to attenuate the comparative signal on the comparative waveguide 30. The chip also includes an output optical attenuator 46 positioned along the utility waveguide 16 such that the output optical attenuator 46 can be operated so as to attenuate the outgoing LIDAR signal on the utility waveguide 16. Suitable attenuators for the data optical attenuator 44 and/or the output optical attenuator 46 are configured to attenuate intensity of a light signal. Examples of a suitable attenuator configured to attenuate intensity of a light signal include carrier injection based PIN diodes, electro-absorption modulators, and Mach-Zehnder (MZ) modulators.

The chip also includes a sampling directional coupler 50 that couples a portion of the comparative signal from the comparative waveguide 30 onto a sampling waveguide 52. The coupled portion of the comparative signal serves as a sampling signal. The sampling waveguide 52 carries the sampling signal to a sampling light sensor 54. Although FIG. 1 illustrates a sampling directional coupler 50 moving a portion of the comparative signal onto the sampling waveguide 52, other signal tapping components can be used to move a portion of the comparative signal from the comparative waveguide 30 onto the sampling waveguide 52. Examples of suitable signal tapping components include, but are not limited to, y-junctions, and MMIs.

The chip includes a control branch 55 for controlling operation of the laser cavity. The control branch includes a directional coupler 56 that moves a portion of the outgoing LIDAR signal from the utility waveguide 16 onto a control waveguide 57. The coupled portion of the outgoing LIDAR signal serves as a tapped signal. Although FIG. 1 illustrates a directional coupler 56 moving a portion of the outgoing LIDAR signal onto the control waveguide 57, other signal-tapping components can be used to move a portion of the outgoing LIDAR signal from the utility waveguide 16 onto the control waveguide 57. Examples of suitable signal tapping components include, but are not limited to, y-junctions, and MMIs.

The control waveguide 57 carries the tapped signal to an interferometer 58 that splits the tapped signal and then re-combines the different portions of the tapped signal with a phase differential between the portions of the tapped signal. The illustrated interferometer 58 is a Mach-Zehnder interferometer; however, other interferometers can be used.

The interferometer 58 outputs a control light signal on an interferometer waveguide 60. The interferometer waveguide 60 carries the control light signal to a control light sensor 61 that converts the control light signal to an electrical signal that serves as an electrical control signal. The interferometer signal has an intensity that is a function of the frequency of the outgoing LIDAR signal. For instance, a Mach-Zehnder interferometer will output a sinusoidal control light signal with a fringe pattern. Changes to the frequency of the outgoing LIDAR signal will cause changes to the frequency of the control light signal. Accordingly, the frequency of the electrical control signal output from the control light sensor 61 is a function of the frequency of the outgoing LIDAR signal. Other detection mechanisms can be used in place of the control light sensor 61. For instance, the control light sensor 61 can be replaced with a balanced photodetector arranged as the light combining component 28, the first light sensor 40 and the second light sensor 42.

Electronics 62 can operate one or more components on the chip. For instance, the electronics 62 can be in electrical communication with and control operation of the light source 10, the data optical attenuator 44, output optical attenuator 46, the first light sensor 40, the second light sensor 42, the sampling light sensor 54, and the control light sensor 61. Although the electronics 62 are shown off the chip, all or a portion of the electronics can be included on the chip. For instance, the chip can include electrical conductors that connect the first light sensor 40 in series with the second light sensor 42.

During operation of the chip, the electronics 62 operate the light source 10 such that the laser cavity outputs the outgoing LIDAR signal. The electronics 62 then operate the chip through a series of cycles where each cycle generates LIDAR data (radial velocity and/or distance between a reflecting object and the LIDAR system) for a sample region in a field of view. During each cycle, the data signal is sampled multiple times. During each of the samples, the electronics tune the frequency of the outgoing LIDAR signal. As will be described in more detail below, the electronics can employ output from the control branch in order to control the frequency of the outgoing LIDAR signal such that the frequency of the outgoing LIDAR signal as a function of time is known to the electronics. In some instance, a cycle includes multiple periods. For instance, a cycle can include a first period and a second period. During the first period, the electronics 62 can linearly increase the frequency of the outgoing LIDAR signal and during a second period the electronics 62 can linearly decrease the frequency of the outgoing LIDAR signal. For instance, the laser cavity can be configured to output an outgoing LIDAR signal (and accordingly a LIDAR output signal) with a wavelength of 1550 nm. During the first period, the electronics 62 can increase the frequency of the outgoing LIDAR signal (and accordingly a LIDAR output signal) such that the wavelength decreases from 1550 nm to 1459.98 nm followed by decreasing the frequency of the outgoing LIDAR signal such that the wavelength increases from 1459.98 nm to 1550 nm.

When the outgoing LIDAR signal frequency is increased during the first period, the LIDAR output signal travels away from the chip and then returns to the chip as a LIDAR input signal. A portion of the LIDAR input signal becomes the comparative signal. During the time that the LIDAR output signal and the LIDAR input signal are traveling between the chip and a reflecting object, the frequency of the outgoing LIDAR signal continues to increase. Since a portion of the outgoing LIDAR signal becomes the reference signal, the frequency of the reference signal continues to increase. As a result, the comparative signal enters the light-combining component with a lower frequency than the reference signal concurrently entering the light-combining component. Additionally, the further the reflecting object is located from the chip, the more the frequency of the reference signal increases before the LIDAR input signal returns to the chip. Accordingly, the larger the difference between the frequency of the comparative signal and the frequency of the reference signal, the further the reflecting object is from the chip. As a result, the difference between the frequency of the comparative signal and the frequency of the reference signal is a function of the distance between the chip and the reflecting object.

For the same reasons, when the outgoing LIDAR signal frequency is decreased during the second period, the comparative signal enters the light-combining component with a higher frequency than the reference signal concurrently entering the light-combining component and the difference between the frequency of the comparative signal and the frequency of the reference signal during the second period is also function of the distance between the chip and the reflecting object.

In some instances, the difference between the frequency of the comparative signal and the frequency of the reference signal can also be a function of the Doppler effect because relative movement of the chip and reflecting object can also affect the frequency of the comparative signal. For instance, when the chip is moving toward or away from the reflecting object and/or the reflecting object is moving toward or away from the chip, the Doppler effect can affect the frequency of the comparative signal. Since the frequency of the comparative signal is a function of the speed the reflecting object is moving toward or away from the chip and/or the speed the chip is moving toward or away from the reflecting object, the difference between the frequency of the comparative signal and the frequency of the reference signal is also a function of the speed the reflecting object is moving toward or away from the chip and/or the speed the chip is moving toward or away from the reflecting object. Accordingly, the difference between the frequency of the comparative signal and the frequency of the reference signal is a function of the distance between the chip and the reflecting object and is also a function of the Doppler effect.

The composite sample signal and the data signal each effectively compares the comparative signal and the reference signal. For instance, since the light-combining component combines the comparative signal and the reference signal and these signals have different frequencies, there is beating between the comparative signal and reference signal. Accordingly, the composite sample signal and the data signal have a beat frequency related to the frequency difference between the comparative signal and the reference signal and the beat frequency can be used to determine the difference in the frequency of the comparative signal and the reference signal. A higher beat frequency for the composite sample signal and/or the data signal indicates a higher differential between the frequencies of the comparative signal and the reference signal. As a result, the beat frequency of the data signal is a function of the distance between the chip and the reflecting object and is also a function of the Doppler effect. The electronics 62 can process the data signal so as to determine the beat frequency.

The beat frequencies from two or more different periods in the same cycle can be combined to generate LIDAR data (the radial velocity and/or distance between the LIDAR system and one or more objects located outside of the LIDAR system). For instance, the beat frequency determined from a first period in one of the cycles can be combined with the beat frequency determined from the second period from the same cycle to determine the LIDAR data for a sample region. As an example, the following equation applies during a period where electronics increase the frequency of the outgoing LIDAR signal during the period such as occurs in first period described above: $f_{ub} = -f_d + \alpha\tau$ where $f_{ub}$ is the beat frequency, $\alpha$ is the rate of frequency change, $f_d$ represents the Doppler shift ($f_d = 2vf_c/c$) where $f_c$ represents the optical frequency ($f_o$), c represents the speed of light, v is the radial velocity between the reflecting object and the LIDAR system where the direction from the reflecting object toward the LIDAR system is assumed to be the positive direction, and c is the speed of light. The following equation applies during a period where electronics decrease the frequency of the outgoing LIDAR signal during the period such as occurs in second period described above: $f_{db} = -f_d - \alpha\tau$ where $f_{db}$, is the beat frequency. In these two equations, $f_d$ and $\tau$ are unknowns. The electronics solve these two equations for the two unknowns. The radial velocity for the sample region then be determined from the Doppler shift ($v = c*f_d/(2f_c)$) and/or the separation distance for that sample region can be determined from $c*f_d/2$.

During operation, the electronics 62 can adjust the frequency of the outgoing LIDAR signal in response to the electrical control signal output from the control light sensor 61. As noted above, the magnitude of the electrical control signal output from the control light sensor 61 is a function of the frequency of the outgoing LIDAR signal. Accordingly, the electronics 62 can adjust the frequency of the outgoing LIDAR signal in response to the magnitude of the control. For instance, while changing the frequency of the outgoing LIDAR signal during one of the sample, the electronics 62 can have a range of suitable values for the electrical control signal magnitude as a function of time. At multiple different times during a sample, the electronics 62 can compare the electrical control signal magnitude to the range of values associated with the current time in the sample. If the electrical control signal magnitude indicates that the frequency of the outgoing LIDAR signal is outside the associated range of electrical control signal magnitudes, the electronics 62 can operate the light source 10 so as to change the frequency of the outgoing LIDAR signal so it falls within the associated range. If the electrical control signal magnitude indicates that the frequency of the outgoing LIDAR signal is within the associated range of electrical control signal magnitudes, the electronics 62 do not change the frequency of the outgoing LIDAR signal.

During operation, the electronics 62 can adjust the level of attenuation provided by the output optical attenuator 46 in response to the sampling signal from the sampling light sensor 54. For instance, the electronics 62 operate the output optical attenuator 46 so as to increase the level of attenuation in response to the magnitude of the sampling signal being above a first signal threshold and/or decrease the magnitude of the power drop in response to the magnitude of the sampling signal being below a second signal threshold.

In some instances, the electronics 62 adjust the level of attenuation provided by the output optical attenuator 46 to prevent or reduce the effects of back-reflection on the performance of the laser cavity. For instance, the first signal threshold and/or the second signal threshold can optionally be selected to prevent or reduce the effects of back-reflection on the performance of the laser cavity. Back reflection occurs when a portion of the LIDAR input signal returns to the laser cavity as a returned LIDAR signal. In some instances, on the order of 50% of the LIDAR input signal that passes through the beam-steering mechanism 18 returns to the laser cavity. The returned LIDAR signal can affect performance of the laser cavity when the power of the returned LIDAR signal entering the partial return device 14 does not decrease below the power of the outgoing LIDAR signal exiting from the partial return device 14 ("power drop") by more than a minimum power drop threshold. In the illustrated chip, the minimum power drop threshold can be around 35 dB (0.03%). Accordingly, the returned LIDAR signal can affect the performance of the laser cavity when the power of the returned LIDAR signal entering the partial return device 14 is not more than 35 dB below the power of the outgoing LIDAR signal exiting from the partial return device 14.

The electronics 62 can operate the output optical attenuator 46 so as to reduce the effect of low power drops, e.g. when the target object is very close or highly reflective or both. As is evident from FIG. 1, operation of the output optical attenuator 46 so as to increase the level of attenuation reduces the power of the returned LIDAR signal entering the partial return device 14 and also reduces the power of the returned outgoing LIDAR signal at a location away from the partial return device 14. Since the output optical attenuator 46 is located apart from the partial return device 14, the power of the outgoing LIDAR signal exiting from the partial return device 14 is not directly affected by the operation of the output optical attenuator 46. Accordingly, the operation of the output optical attenuator 46 so as to increase the level of attenuation increases the level of the power drop. As a result, the electronics can employ the optical attenuator 46 so as to tune the power drop.

Additionally, the magnitude of the sampling signal is related to the power drop. For instance, the magnitude of the sampling signal is related to the power of the comparative signal as is evident from FIG. 1. Since the comparative signal is a portion of the LIDAR input signal, the magnitude of the sampling signal is related to the power of the LIDAR input signal. This result means the magnitude of the sampling signal is also related to the power of the returned LIDAR signal because the returned LIDAR signal is a portion of the LIDAR input signal. Accordingly, the magnitude of the sampling signal is related to the power drop.

Since the magnitude of the sampling signal is related to the power drop, the electronics 62 can use the magnitude of the sampling signal to operate the output optical attenuator so as to keep the magnitude of the comparative signal power within a target range. For instance, the electronics 62 can operate the output optical attenuator 46 so as to increase the magnitude of the power drop in response to the sampling signal indicating that the magnitude of power drop is at or below a first threshold and/or the electronics 62 can operate the output optical attenuator 46 so as to decrease the magnitude of the power drop in response to the sampling signal indicating that the magnitude of power drop is at or above a second threshold. In some instances, the first threshold is greater than or equal to the minimum power drop threshold. In one example, the electronics 62 operate the output optical attenuator 46 so as to increase the magnitude of the power drop in response to the magnitude of the sampling signal being above a first signal threshold and/or decrease the magnitude of the power drop in response to the magnitude of the sampling signal being below a second signal threshold. The identification of the value(s) for one, two, three, or four variables selected from the group consisting of the first threshold, the second threshold, the first signal threshold, and the second signal threshold can be determined from calibration of the optical chip during set-up of the LIDAR chip system.

Light sensors can become saturated when the power of the composite light signal exceeds a power threshold. When a light sensor becomes saturated, the magnitude of the data signal hits a maximum value that does not increase despite additional increases in the power of the composite light signal above the power threshold. Accordingly, data can be lost when the power of the composite light signal exceeds a power threshold. During operation, the electronics 62 can adjust the level of attenuation provided by the data optical attenuator 44 so the power of the composite light signal is maintained below a power threshold.

As is evident from FIG. 1, the magnitude of the sampling signal is related to the power of the comparative signal. Accordingly, the electronics 62 can operate the data optical attenuator 44 in response to output from the sampling signal. For instance, the electronics 62 can operate the data optical attenuator so as to increase attenuation of the comparative signal when the magnitude of the sampling signal indicates the power of the comparative signal is above an upper comparative signal threshold and/or can operate the data optical attenuator so as to decrease attenuation of the comparative signal when the magnitude of the sampling signal indicates the power of the comparative signal is below a lower comparative signal threshold. For instance, in some instances, the electronics 62 can increase attenuation of the comparative signal when the magnitude of the sampling signal is at or above an upper comparative threshold and/or the electronics 62 decrease attenuation of the comparative signal when the magnitude of the sampling signal is at or below an upper comparative signal threshold.

Figure 2:
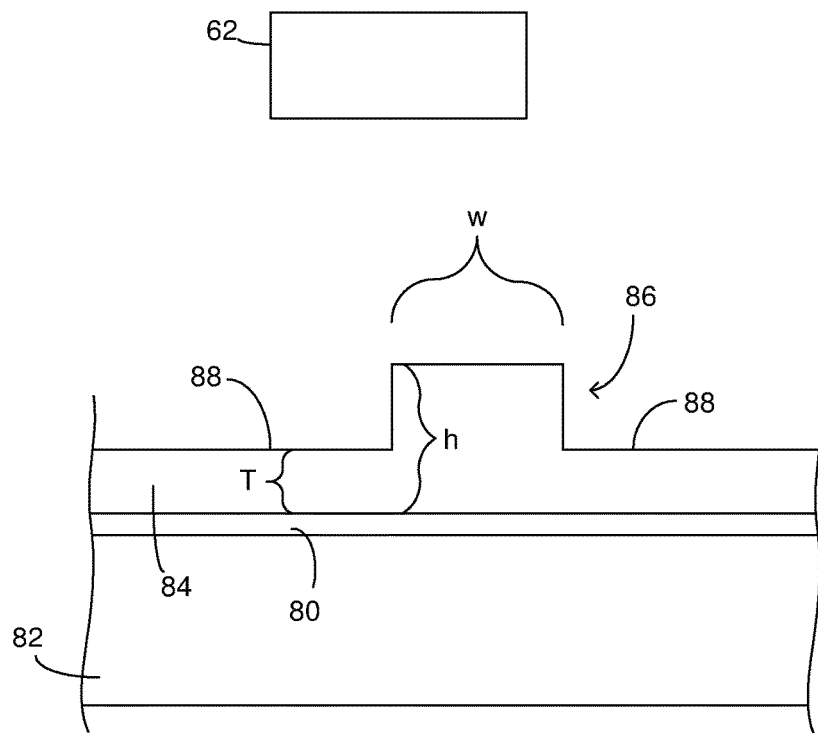
FIG. 2 is a cross-section of portion of a chip constructed from a silicon-on-insulator wafer.

As noted above, the electronics 62 can adjust the level of attenuation provided by the output optical attenuator 46 in response to the sampling signal. The electronics 62 can adjust the level of attenuation provided by the data optical attenuator 44 in response to the sampling signal in addition or as an alternative to adjusting the level of attenuation provided by the output optical attenuator 46 in response to the sampling signal Suitable platforms for the chip include, but are not limited to, silica, indium phosphide, and silicon-on-insulator wafers. FIG. 2 is a cross-section of portion of a chip constructed from a silicon-on-insulator wafer. A silicon-on-insulator (SOI) wafer includes a buried layer 80 between a substrate 82 and a light-transmitting medium 84. In a silicon-on-insulator wafer, the buried layer is silica while the substrate and the light-transmitting medium are silicon. The substrate of an optical platform such as an SOI wafer can serve as the base for the entire chip. For instance, the optical components shown in FIG. 1 can be positioned on or over the top and/or lateral sides of the substrate.

The portion of the chip illustrated in FIG. 2 includes a waveguide construction that is suitable for use with chips constructed from silicon-on-insulator wafers. A ridge 86 of the light-transmitting medium extends away from slab regions 88 of the light-transmitting medium. The light signals are constrained between the top of the ridge and the buried oxide layer.

The dimensions of the ridge waveguide are labeled in FIG. 2. For instance, the ridge has a width labeled w and a height labeled h. A thickness of the slab regions is labeled T. For LIDAR applications, these dimensions are more important than other applications because of the need to use higher levels of optical power than are used in other applications. The ridge width (labeled w) is greater than 1 µm and less than 4 µm, the ridge height (labeled h) is greater than 1 µm and less than 4 µm, the slab region thickness is greater than 0.5 µm and less than 3 µm. These dimensions can apply to straight or substantially straight portions of the waveguide, curved portions of the waveguide and tapered portions of the waveguide(s). Accordingly, these portions of the waveguide will be single mode. However, in some instances, these dimensions apply to straight or substantially straight portions of a waveguide while curved portions of the waveguide and/or tapered portions of the waveguide have dimensions outside of these ranges. For instance, the tapered portions of the utility waveguide 16 illustrated in FIG. 1 can have a width and/or height that is >4 µm and can be in a range of 4 µm to 12 µm. Additionally or alternately, curved portions of a waveguide can have a reduced slab thickness in order to reduce optical loss in the curved portions of the waveguide. For instance, a curved portion of a waveguide can have a ridge that extends away from a slab region with a thickness greater than or equal to 0.0 µm and less than 0.5 µm. While the above dimensions will generally provide the straight or substantially straight portions of a waveguide with a single-mode construction, they can result in the tapered section(s) and/or curved section(s) that are multi-mode. Coupling between the multi-mode geometry to the single mode geometry can be done using tapers that do not substantially excite the higher order modes. Accordingly, the waveguides can be constructed such that the signals carried in the waveguides are carried in a single mode even when carried in waveguide sections having multi-mode dimensions. The waveguide construction of FIG. 2 is suitable for all or a portion of the waveguides selected from the group consisting of the cavity waveguide 12, utility waveguide 16, reference waveguide 27, comparative waveguide 30, first detector waveguide 36, second detector waveguide 38, sampling waveguide 52, control waveguide 57, and interferometer waveguide 60.

The light source 10 that is interfaced with the utility waveguide 16 can be a gain element that is a component separate from the chip and then attached to the chip. For instance, the light source 10 can be a gain element that is attached to the chip using a flip-chip arrangement.

Use of flip-chip arrangements is suitable when the light source 10 is to be interfaced with a ridge waveguide on a chip constructed from silicon-on-insulator wafer. Examples of suitable interfaces between flip-chip gain elements and ridge waveguides on chips constructed from silicon-on-insulator wafer can be found in U.S. Pat. No. 9,705,278, issued on Jul. 11, 2017 and in U.S. Pat. No. 5,991,484 issued on Nov. 23, 1999; each of which is incorporated herein in its entirety. The constructions are suitable for use as the light source 10. When the light source 10 is a gain element, the electronics 62 can change the frequency of the outgoing LIDAR signal by changing the level of electrical current applied to through the gain element.

The attenuators can be a component that is separate from the chip and then attached to the chip. For instance, the attenuator can be included on an attenuator chip that is attached to the chip in a flip-chip arrangement. The use of attenuator chips is suitable for all or a portion of the attenuators selected from the group consisting of the data attenuator and the control attenuator.

As an alternative to including an attenuator on a separate component, all or a portion of the attenuators can be integrated with the chip. For instance, examples of attenuators that are interfaced with ridge waveguides on a chip constructed from a silicon-on-insulator wafer can be found in U.S. Pat. No. 5,908,305, issued on Jun. 1, 1999; each of which is incorporated herein in its entirety. The use of attenuators that are integrated with the chip are suitable for all or a portion of the light sensors selected from the group consisting of the data attenuator and the control attenuator.

Light sensors that are interfaced with waveguides on a chip can be a component that is separate from the chip and then attached to the chip. For instance, the light sensor can be a photodiode, or an avalanche photodiode. Examples of suitable light sensor components include, but are not limited to, InGaAs PIN photodiodes manufactured by Hamamatsu located in Hamamatsu City, Japan, or an InGaAs APD (Avalanche Photo Diode) manufactured by Hamamatsu located in Hamamatsu City, Japan. These light sensors can be centrally located on the chip as illustrated in FIG. 1. Alternately, all or a portion the waveguides that terminate at a light sensor can terminate at a facet 204 located at an edge of the chip and the light sensor can be attached to the edge of the chip over the facet 204 such that the light sensor receives light that passes through the facet 204. The use of light sensors that are a separate component from the chip is suitable for all or a portion of the light sensors selected from the group consisting of the first light sensor 40, the second light sensor 42, the sampling light sensor 54, and the control light sensor 61.

As an alternative to a light sensor that is a separate component, all or a portion of the light sensors can be integrated with the chip. For instance, examples of light sensors that are interfaced with ridge waveguides on a chip constructed from a silicon-on-insulator wafer can be found in Optics Express Vol. 15, No. 21, 13965-13971 (2007); U.S. Pat. No. 8,093,080, issued on Jan. 10, 2012; U.S. Pat. No. 8,242,432, issued Aug. 14, 2012; and U.S. Pat. No. 6,108, 8472, issued on Aug. 22, 2000 each of which is incorporated herein in its entirety. The use of light sensors that are integrated with the chip are suitable for all or a portion of the light sensors selected from the group consisting of the first light sensor 40, the second light sensor 42, the sampling light sensor 54, and the control light sensor 61.

Figure 3A:
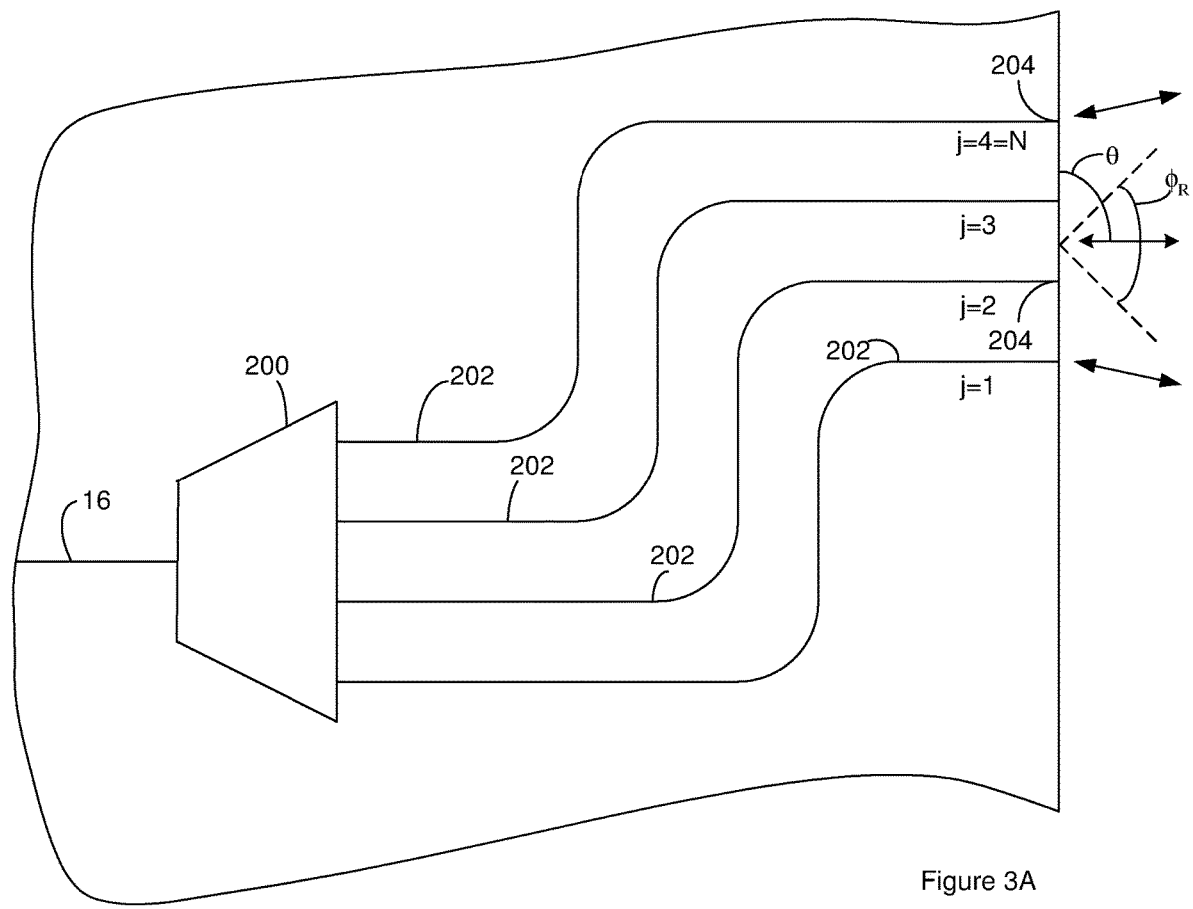
FIG. 3A illustrates a portion of the chip modified so as to use a phase differential between output signals to steer a LIDAR output signal.
Figure 3B:
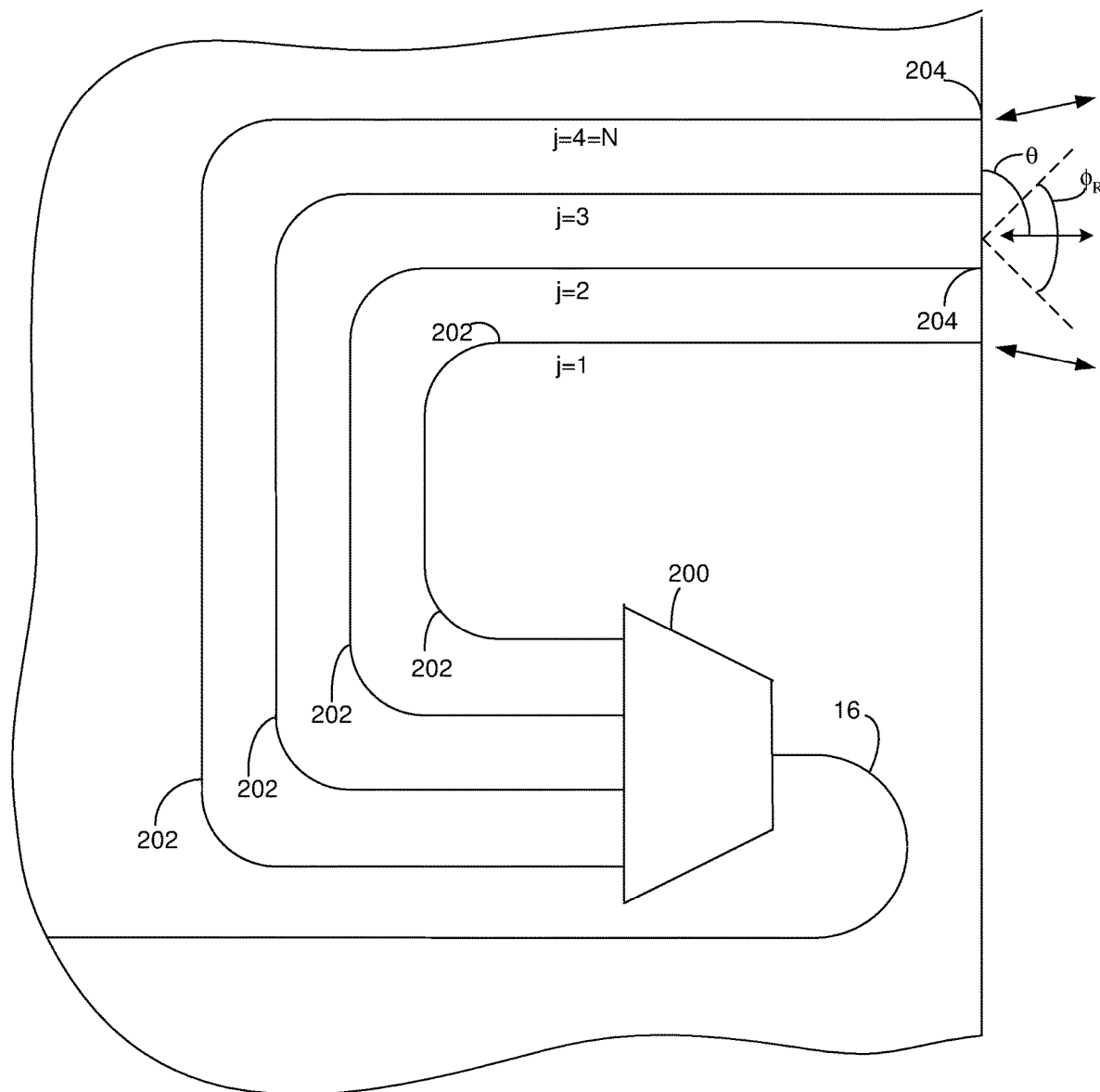
FIG. 3B illustrates a portion of another embodiment of the chip modified so as to use a phase differential between output signals to steer a LIDAR output signal.

FIG. 3A and FIG. 3B is a topview of a portion of a LIDAR chip having a beam-steering mechanism 18 that is suitable for use with the LIDAR chip. The beam-steering mechanism 18 is configured to use the phase differential between output signals to steer the LIDAR output signals. The portion(s) of the chip that are not illustrated in FIG. 3A and FIG. 3B can be constructed as described above. For instance, the utility waveguide 16 shown in FIG. 3A and FIG. 3B can be the utility waveguide 16 of a chip constructed as shown in FIG. 1 and FIG. 2.

The utility waveguide 16 in FIG. 3A and FIG. 3B carries the outgoing LIDAR signal to a splitter 200 that divides the outgoing LIDAR signal into multiple output signals that are each carried on a steering waveguide 202. Each of the steering waveguides 202 ends at a facet 204. The facets 204 are arranged such that the output signals exiting the chip through the facets 204 combine to form the LIDAR output signal. During operation of the chip, at least a portion of the LIDAR output signal is reflected by an object located off the chip. At least a portion of the reflected signal returns to the facets 204 of the steering waveguides 202 and enters the steering waveguides 202 as a portion of a LIDAR input signal. The steering waveguides 202 carry the portions of the LIDAR input signal to the splitter 200 where they are combined into the LIDAR input signal carried on the utility waveguide 16.

The splitter 200 and steering waveguides 202 can be constructed such that there is a phase differential between output signals at the facet 204 of adjacent steering waveguides 202. For instance, the splitter 200 and steering waveguides 202 can be constructed such that there is a linearly increasing phase differential between output signals at the facet 204 of adjacent steering waveguides 202. For instance, the steering waveguides 202 can be constructed such that the phase of steering waveguide number j is $f_o+(j-1)f$ where j is an integer from 1 to N and represents the number associated with a steering waveguide when the steering waveguides are sequentially numbered as shown in FIG. 3A and FIG. 3B, f is the phase differential between neighboring steering waveguides, and $f_o$ is the phase of the output signal at the facet 204 of steering waveguide j=1. In some instances, the phase differential is achieved by constructing the steering waveguides such that the steering waveguides have a linearly increasing length differential. For instance, the length of steering waveguide j can be represented by $L_o+(j-1)\Delta L$ where j is an integer from 1 to N and represents the number associated with a steering waveguide when the steering waveguides are sequentially numbered as shown in FIG. 3A and FIG. 3B, $\Delta L$ is the length differential between neighboring steering waveguides, and $L_o$ is the length of steering waveguide j=1. Suitable $\Delta L$ include, but are not limited to, $\Delta L$ greater than 0, or 5 and/or less than 25, or 50 μm. Suitable f include, but are not limited to, f greater than 0π, or 7π and/or less than 15π, or 20π. Suitable N include, but are not limited to, N greater than 10, or 500 and/or less than 1000, or 2000. Suitable splitters include, but are not limited to, star couplers, cascaded Y-junctions and cascaded 1×2 MIMI couplers. The steering waveguides 202 configuration of FIG. 3B may be preferred as the length differential between neighboring steering waveguides (ΔL) increases.

As is evident in FIG. 3A and FIG. 3B, the steering waveguides 202 can each exclude a phase tuner. In some instances, more than 10% of the N steering waveguides or more than 50% of the N steering waveguides each excludes a phase tuner.

Figure 4:
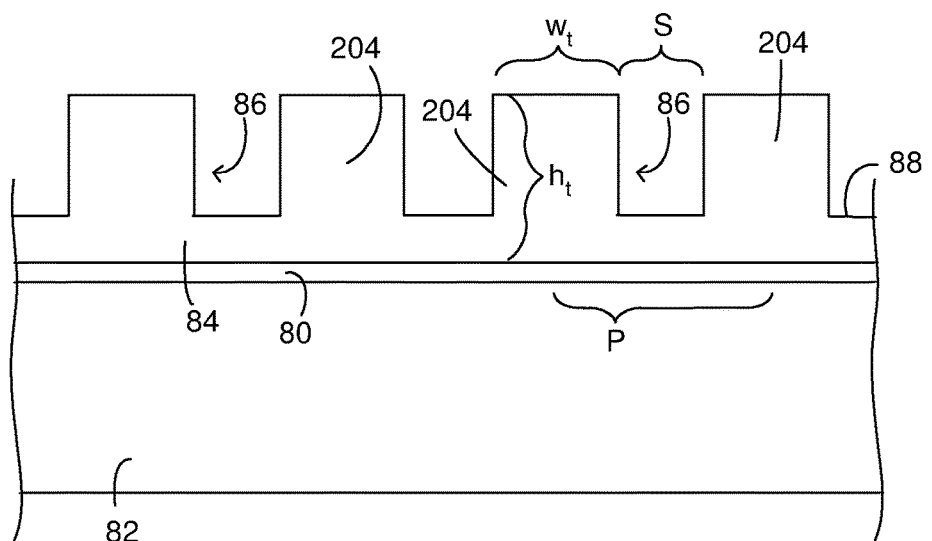
FIG. 4 is a sideview of the chip of FIG. 3A or FIG. 3B looking towards the facets from off of the chip.

FIG. 4 is a sideview of the chip of FIG. 3A or FIG. 3B looking towards the facets from off of the chip. The steering waveguides are constructed according to FIG. 2. The pitch is the distance between the facets and is labeled P in FIG. 4. The pitch can be measured center-to-center or from lateral side one facet 204 to the corresponding lateral side of the adjacent facet 204. Reducing the pitch increases the range of angles over which the LIDAR output signal can be scanned effectively. However, as the facets approach each other, evanescent coupling can occur. Evanescent coupling is prevented or reduced when the separation between the adjacent lateral sides of the facets 204 (labeled S in FIG. 4) is greater than 1 μm.

Figure 5:
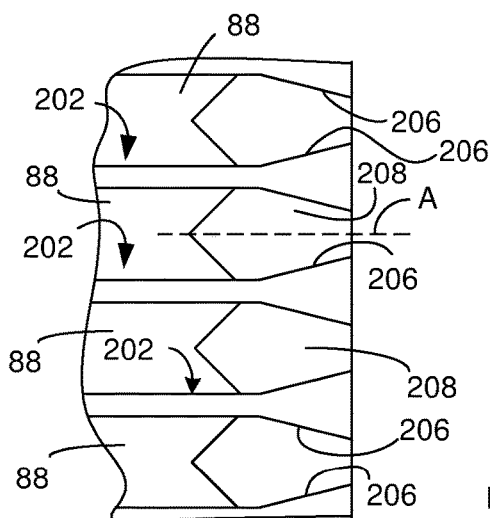
FIG. 5 is a topview of a chip having multiple steering waveguides that each includes a taper that terminates at a facet.

One or more of the steering waveguides can include tapers. For instance, FIG. 5 is a topview of a chip where at least a portion of the steering waveguides each includes a taper 206 that terminates at one of the facets 204. Although the tapers are shown terminating at the facets 204, the tapers can be terminated before the facet 204. Accordingly, there can be an untapered portion of a steering waveguide between a taper and a facet 204. Although the tapers 206 in FIG. 5 are shown as expanding the width of the steering waveguides at they approach the facets, the tapers 206 can be constructed so as to contract the width of the steering waveguides at they approach the facets. Reducing the width of the steering waveguides at the facet can help bring the facets of different steering waveguides closer together. As a result, width reducing tapers can preserve low pitch levels and while also permitting a separation level that prevents or reduce coupling between adjacent steering waveguides.

The tapers illustrated in FIG. 5 are horizontal tapers, however, the tapers can also be vertical. The width of the facet is labeled $w_f$ in FIG. 4 and the height of the facet is labeled $h_f$ in FIG. 4. The tapers can be constructed such that the width of the facet ($w_f$) is less than 30, 20, or 10 μm and/or greater than 5, 2, or 1 μm. Accordingly, an untapered portion of a steering waveguide located between the taper and the splitter 200 can have a width greater than 1 μm and less than 4 μm and a height greater than 1 μm and less than 4 μm and an untapered portion of a steering waveguide located between the taper and the facet and/or the facet itself can have a width greater than 1 μm and less than 4 μm and a height greater than 1 μm and less than 4 μm. Additionally or alternately, the tapers can be constructed such that the separation between adjacent facets is greater than 0.2, 0.3, or 0.4 μm and/or less than 0.6, 0.8, or 1 μm while the pitch is greater than 1.5, 3, or 6 μm and/or less than 10, 20, or 30 μm. With these dimensions and at 1550 nm wavelength, a scanning angle range ($\phi_R$) greater than 60°, 30°, or 20° and/or less than 5°, 3°, or 1° can be achieved.

Figure 6A:
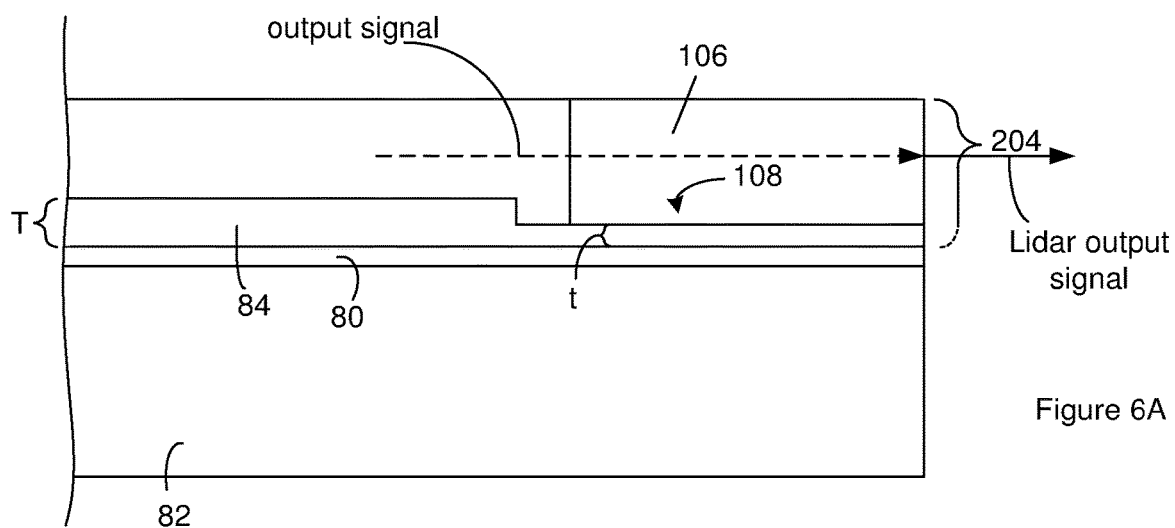
FIG. 6A is a sideview of a cross section of a portion of the chip shown in FIG. 5. The cross section is taken along the line labeled A in FIG. 5.
Figure 6B:
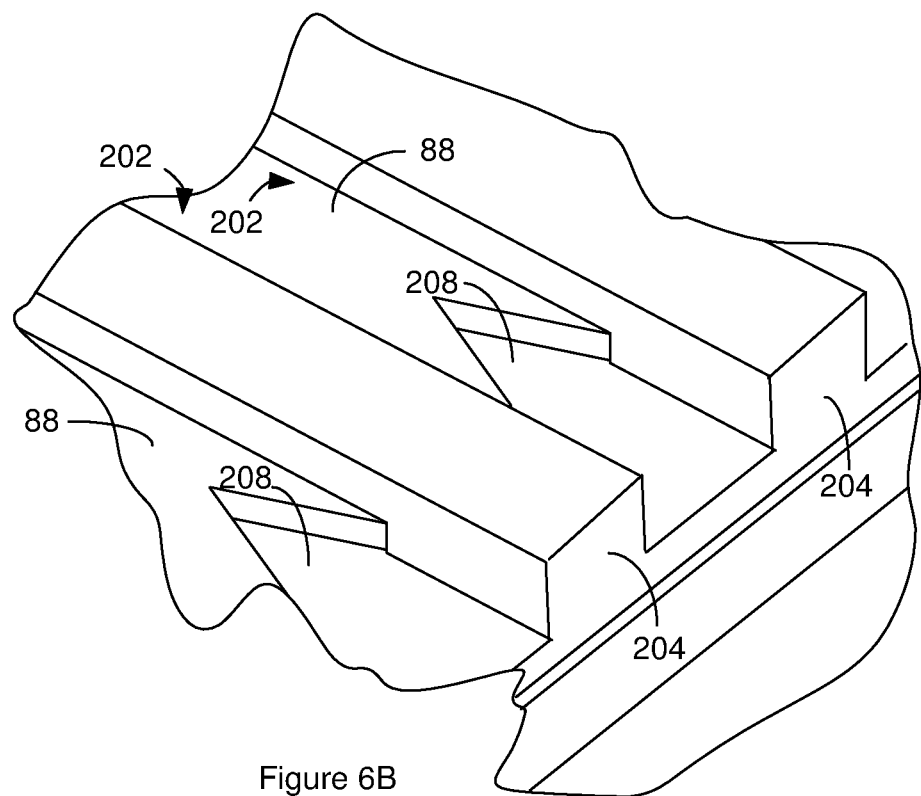
FIG. 6B is a perspective view of a portion of the chip shown in FIG. 5.

Optical coupling between steering waveguides in the region of the facets 204 can be reduced by reducing the thickness of the slab regions in the region of the facets 204. FIG. 6A is a sideview of a cross section of a portion of the chip shown in FIG. 5. The cross section is taken along the line labeled A in FIG. 5. Since FIG. 6A is a sideview, chip features that are in the background of the cross section are also illustrated. For instance, the cross section is taken through a slab region 88; however, a ridge of a steering waveguides 202 is visible behind the slab region 88. FIG. 6B is a perspective view of a portion of the chip shown in FIG. 5. The image shown in FIG. 6B does not include the tapers 206 that are shown in FIG. 5 although the slab region configuration shown in FIG. 6B can be used in conjunction with the tapers 206.

The steering waveguides 202 each extends from a slab region 88. The thickness of the slab regions 88 decreases as the slab region 88 approaches the facets and/or the lateral side of the chip. For instance, the slab regions include a recess 208 that extends at least partway into the slab region 88. When the recess 208 extends part way through the slab region 88 as shown in FIG. 6A, the light-transmitting medium 84 at the bottom of the recess 208 can be continuous with the light-transmitting medium 84 in the slab region and accordingly serves as a reduced portion of the slab region 88. The thickness of slab region is labeled T in FIG. 6A and the thickness of reduced slab region is labeled t. A suitable thickness for the reduced slab regions at one or more locations selected from between the facets, adjacent to a facet and at a lateral side of the chip, between the tapers includes, but is not limited to, a thickness greater than 0.0 µm and less than 0.2 µm or 0.5 µm. The chip can be constructed such that a ratio of the slab region thickness (T): reduced slab region thickness (t) is greater than 1.2:1, 2:1 or 4:1 and/or less than 10:1, or 5:1.

Figure 6C:
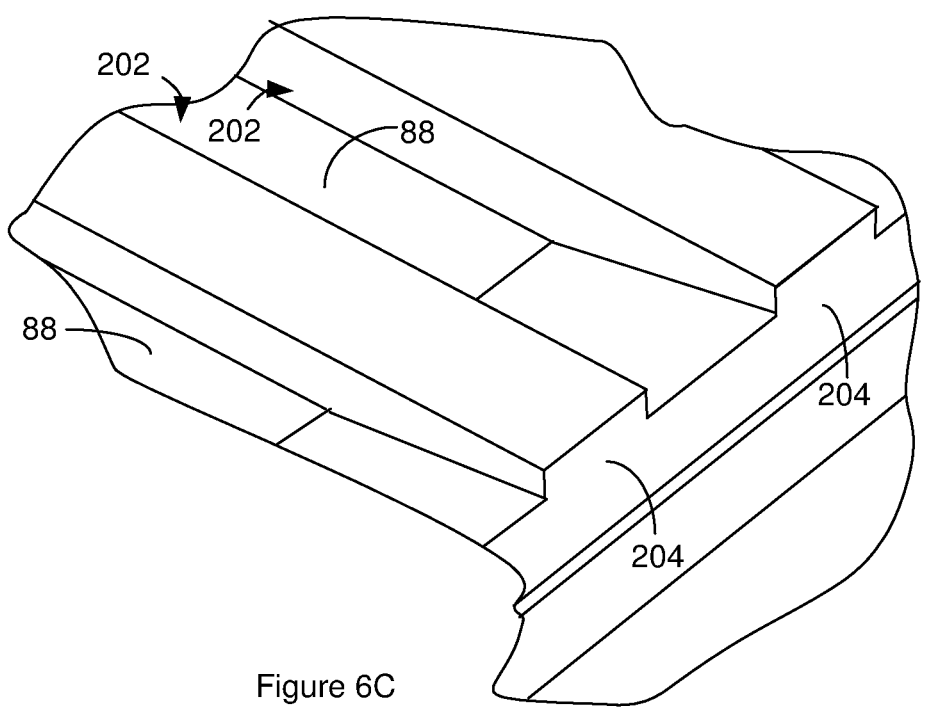
FIG. 6C is a perspective view of a portion of a chip having a tapered slab region.

The slab regions can taper vertically and/or horizontally near the facets. For instance, FIG. 6C is a perspective view of a portion of the chip shown in FIG. 5. The portion of the slab region adjacent to the facets tapers vertically such that the thickness of the slab regions increases as the slab regions approach the facet. The tapers 206 are not shown in FIG. 6C in order to simplify the drawing. However, the vertical and/or horizontal tapers of the slab regions can be used in conjunction with steering waveguide 202 tapers 206 such as are shown in FIG. 5 or tapers 206 that become narrower as the approach the facet. Accordingly, vertical taper(s) of the slab regions such as is shown in FIG. 6C can be positioned between tapered 106 regions of the steering waveguides. Such an arrangement can reduce optical loss.

Figure 7:
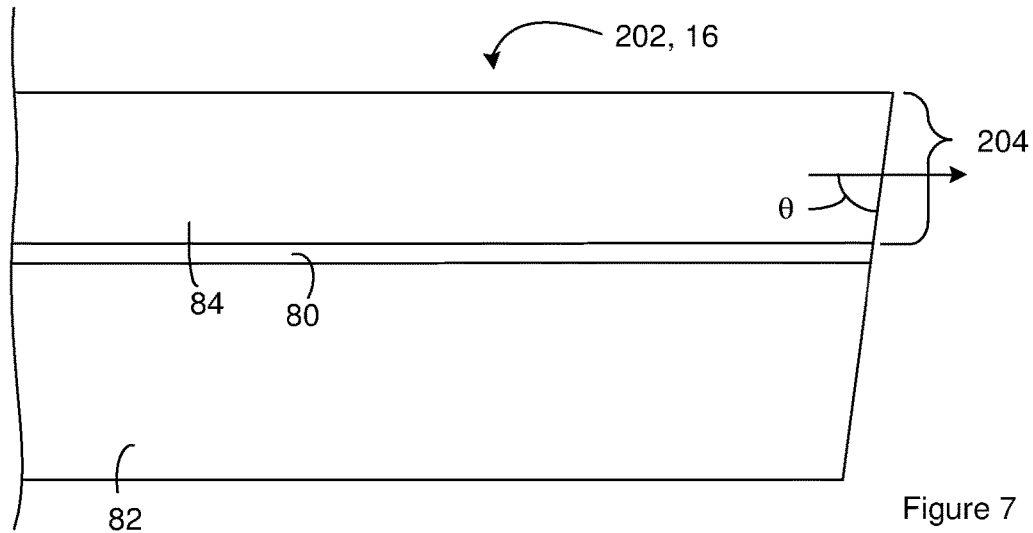
FIG. 7 is a cross section of a waveguide having a non-perpendicular angle between a facet and the direction of propagation of light signals through the waveguide at the facet.

The steering waveguides can be constructed such that the direction of propagation the output signals in the steering waveguides at the facets is substantially parallel to the plane of the device, an upper surface of the substrate and/or a lower surface of the substrate. In some instances, the above facets 204 are perpendicular or substantially perpendicular relative to the base and/or an upper surface of the substrate and/or a lower surface of the substrate. Additionally or alternately, the facets 204 can also be constructed such that the smallest angle between the plane of facet and the direction of propagation of the output signals at the facet is between 80° and 90°. For instance, FIG. 7 is a cross section of a waveguide such as a utility waveguide 16 or a steering waveguide 202 wherein the angle θ represents the smallest angle between the facet and the direction of propagation of the output signals. Suitable values for the angle include, but are not limited to, angles greater than 10°, 9°, or 8° and/or less than 7°, 6°, or As noted above, the steering waveguides 202 are designed such that the length of the steering waveguides 202 increases linearly. The length differential causes diffraction such that light of different wavelengths travels away from chip in different directions (θ). As a result, the electronics can tune the wavelength (or frequency) of a LIDAR output signal in order to tune a direction that the LIDAR output signal travels away from the LIDAR chip. The range of the angles that can be reached with this tuning mechanism is labeled $\phi_R$ in FIG. 3A and FIG. 3B. The rate of change in the angle (θ) per change in frequency of the LIDAR output signal (f) can be written as dθ/df and is a function of the pitch (labeled P in FIG. 4) and the length differential between neighboring steering waveguides (ΔL). For instance, the angular rate of change (dθ/df) increases as the length differential between neighboring steering waveguides (ΔL) increases and the angular rate of change (dθ/df) increases as the pitch decreases. In some instances, the steering waveguides are constructed with a ΔL greater than 50, or 100 µm and/or less than 200, or 300 µm and a pitch, P, greater than 1.5, 3, or 6 µm and/or less than 10, 20, or 30 µm. Suitable N include, but are not limited to, N greater than 100, or 1000 and/or less than 2000, or 3000. In some instances, the splitter 200 and steering waveguides 202 or the steering waveguides 202 are constructed so as to provide an angular rate of change (dθ/df) of greater than 0.001°/GHz, 0.05°/GHz, or 0.1°/GHz and/or less than 0.2°/GHz, 0.3°/GHz, or 0.4°/GHz can be achieved.

During operation of a LIDAR system that includes the LIDAR chip, the LIDAR output signal is directed from one sample region of a field of view to another sample region in the field of view. The electronics can tune the frequency of the LIDAR output signal in order to tune the direction that the LIDAR output signal travels away from the LIDAR chip and accordingly to direct the LIDAR output signal from one sample region to another sample region.

Figure 8:
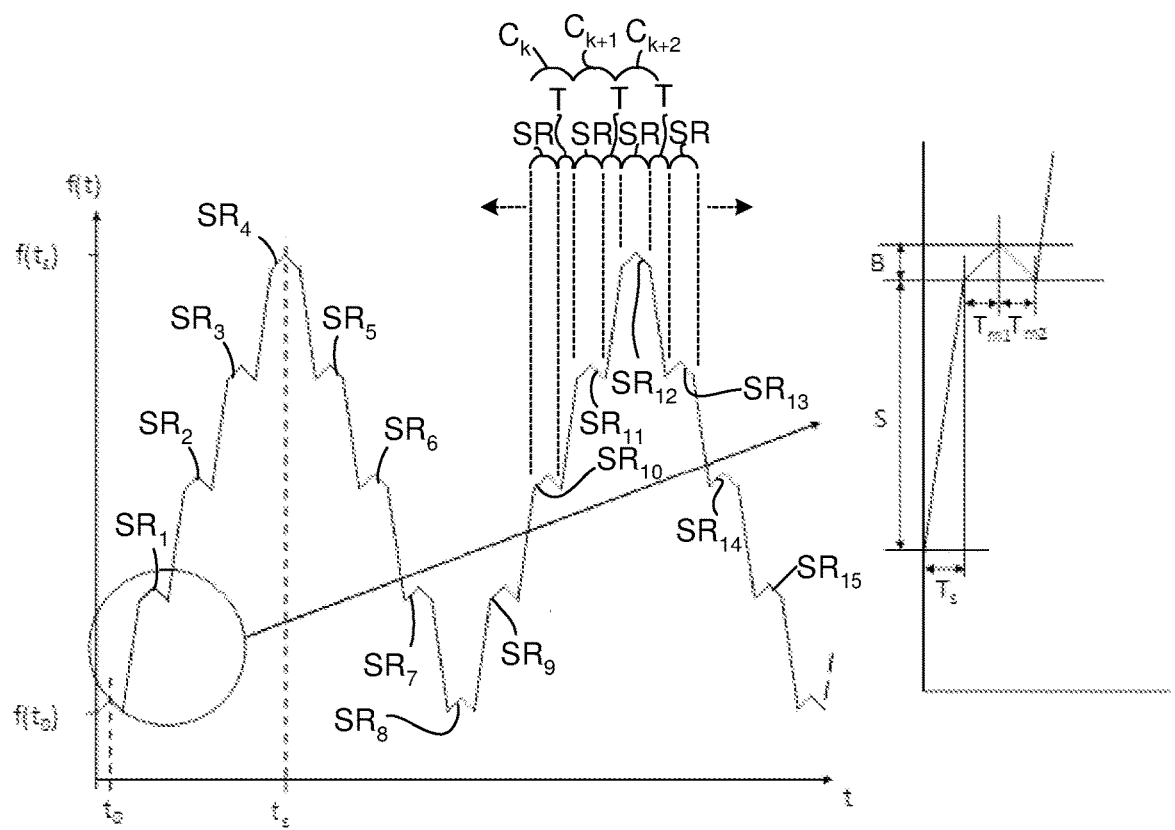
FIG. 8 presents a graph showing an example of the frequency of the LIDAR output signal versus time as the LIDAR output signal is moved to different sample regions in the field of view.

FIG. 8 presents a graph showing an example of the frequency of the LIDAR output signal versus time as the LIDAR output signal is moved to different sample regions in the field of view. The frequency of the LIDAR output signal is shown as a function of time, f(t) and is tuned between $f(t_o)$ and $f(t_s)$. As noted above, the electronics operate the LIDAR chip through a series of cycles. A portion of the cycles that are shown in FIG. 8 are labeled $C_k$. Each cycle includes a transition time labeled "T" and a sample region time labeled "SR."

The transition region times (T) mark the times where the LIDAR output signal is being steered from one sample region to a different sample region. The sample region times (SR) mark the times where the LIDAR output signal is incident on one of the sample regions in the field of view. As a result, the LIDAR data is generated from the LIDAR output signals that are output from the LIDAR chip during the sample region times.

As noted above, each cycle can include multiple periods where LIDAR data is generated. The graph of FIG. 8 illustrates that each sample region time includes a first period and second period although more than two or less than two periods are possible. For instance, the time for one of the cycles is circled in FIG. 8 and blown up on the right of the FIG. 8 image. In the blown up portion of the image, the portion of the time corresponding to the first period is labeled $T_{m1}$ and is labeled portion of the time corresponding to the first period is labeled $T_{m2}$. The frequency of the LIDAR output signal increases during the first period and decreases during the second period; however, the frequency of the LIDAR output signal can be decreased during the first period and increased during the second period. As will be described below, the frequency of the LIDAR output signal need not be changed during different sample periods. For instance, the frequency of the LIDAR output signal can be constant during the first period and/or during the second period.

The change in the frequency of the LIDAR output signal during a sample period can cause the position of the LIDAR output signal on the field of view to change during the sample period. The movement of the LIDAR output signal can be reduced by reducing the duration of the sample period ($T_m$) and/or by reducing the frequency change during the sample period (labeled B in FIG. 8). In some instances, the duration of one or more sample periods ($T_m$) where the frequency of the LIDAR output signal changes during the sample period is greater than 0.1 µs, 0.25 µs, or 0.5 µs and/or less than 1.0 µs, 2.0µ, or 3.0 µs and/or the frequency change (B) is greater than 0.1 GHz, 1 GHz, or 10 GHz and/or less than 20 GHz, 50 GHz, or 100 GHz.

Figure 9:
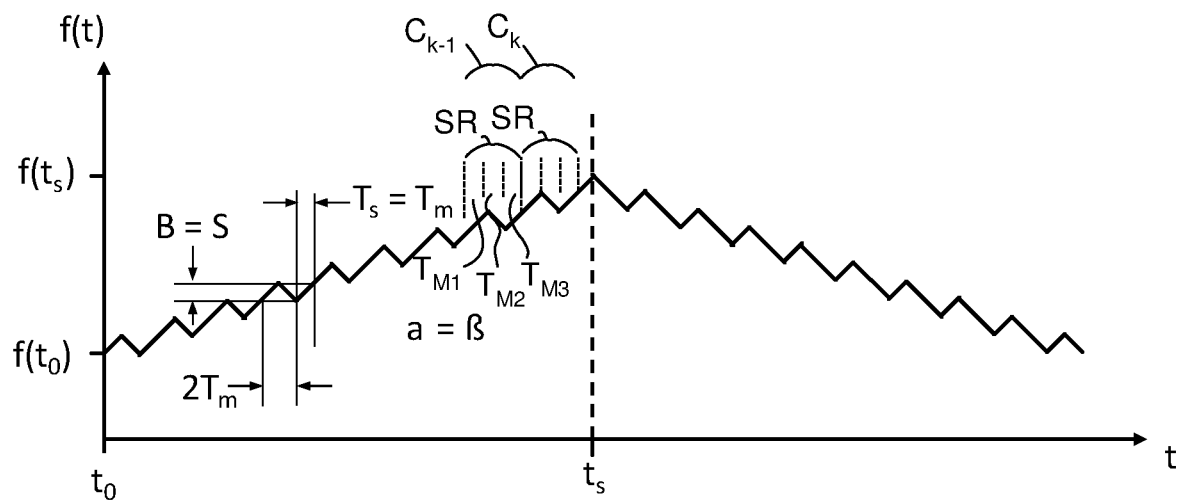
FIG. 9 presents a graph showing an example of the frequency of the LIDAR output signal versus time as the LIDAR output signal is moved to different sample regions in the field of view.

FIG. 8 illustrates the level of movement of the LIDAR output signal during the transition time exceeding the level of movement of the LIDAR output signal during the sample region time. For instance, the change in the frequency during the transition time (labeled S in FIG. 8) is greater than the change in the frequency during the sample region time (labeled B in FIG. 8). This arrangement is suitable for sample regions that are spaced apart from one another; however, as the sample regions move closer together and/or overlap, the change in the frequency during the transition time (labeled S in FIG. 8) can approach the change in the frequency during the sample region time (labeled B in FIG. 8). In some instances, the LIDAR system is operated so as to exclude a transition time between sample region times. As an example, FIG. 9 illustrates an example of a graph of magnitude versus frequency where two cycles are labeled $C_{k-1}$ and $C_k$. The cycles labeled $C_k$ and $C_{k-1}$ in the magnitude versus frequency graph shown in FIG. 9 excludes a transition time between sample region times for cycle $C_k$ and cycle $C_{k-1}$.

In some instances, the change in the frequency during the transition time can be the same as the change in the frequency during the sample region time. For instance, as noted above, FIG. 9 can represent embodiments where each of the cycles includes two sample region times ($TM_2$ and $TM_1$ or $TM_3$) and one of the illustrated sample region times ($TM_1$ or $TM_3$) serves as a transition time. In this embodiment of FIG. 9, the change in the frequency during the transition time (labeled S in FIG. 9) is illustrated as the same as the change in the frequency during the sample region time (labeled B in FIG. 9).

In some instances, a ratio of the change in the frequency during the transition time: the change in the frequency during the sample region time is greater than 1:1, 5:1, or 10:1, and/or less than 20:1, 50:1, or 100:1.

The rate at which LIDAR data can be generated for multiple sample regions can be increased by increasing the rate at which the LIDAR output signal is moved from one sample region to another sample region. As a result, the angular scan rate during the transition region times ($dS/dT_s$ in FIG. 8) can be greater than or equal to the angular scan rate during a sample period where the frequency of the LIDAR output signal changes during the sample period ($dB/dT_{M1}$ or $dB/dT_{M2}$ in FIG. 8). In some instances, a ratio of the angular scan rate during the transition region times ($dS/dT_s$ in FIG. 8): the angular scan rate during a sample period where the frequency of the LIDAR output signal changes is greater than 1:1, 5:1, or 10:1 and/or less than 20:1, 50:1, or 100:1.

In FIG. 8, different sample regions are numbered $SR_1$ through $SR_{15}$. Many of the illustrated sample regions are corresponding sample regions in that they both correspond to the same frequency. FIG. 9 also illustrates corresponding sample regions as the same frequency. In some instances, the LIDAR system is operated such that the corresponding regions on FIG. 8 through FIG. 9 result in the LIDAR output signal being incident on the same sample region of the field of view. For instance, the LIDAR system can be operated such that the LIDAR output signal is incident on the same sample region of the field of view at $SR_1$, $SR_7$, $SR_9$, and $SR_{15}$.

As noted above, the electronics can tune the wavelength (or frequency) of a LIDAR output signal in order to tune a direction that the LIDAR output signal travels away from the LIDAR chip. The electronics can operate a heater so as to tune the wavelength of the LIDAR output signal. For instance, the laser cavity can include a heater configured to tune the wavelength of the outgoing LIDAR signal carried on the utility waveguide 16 and accordingly the wavelength of the LIDAR output signal. More specifically, the heater can be positioned so as to change the temperature of a partial return device such that the wavelength of the outgoing LIDAR signal changes in response to the change in temperature of the partial return device. As an example, FIG. 1A illustrates a heater 214 positioned over the partial return device 14.

The heater can include multiple heating elements that are in electrical communication with one another. The heating elements can include exterior heating elements that are in electrical communication with another one of heating elements and with electronics that drive an electrical current through the heater. The heating elements can include interior heating elements that are in electrical communication with two of the other heating elements.

In some instances, one or more of the heating elements is positioned such that a longitudinal axis of the heating element is parallel with the longitudinal axis of the waveguide. For instance, one or more of the heating elements can be centered over the waveguide with the longitudinal axis of the heating element parallel to the longitudinal axis of the waveguide. In some instances, the heating elements are parallel to one another. In some instances, the heating elements are arranged such that a line that is perpendicular to the longitudinal axis of one of the heating elements can pass through the other heating elements. In some instances, the heating elements are arranged such that a line that is perpendicular to the longitudinal axis of one of the heating elements can pass through the other heating elements for at least 80% of the length of the longitudinal axis.

Other LIDAR chip constructions and methods of operation can be found in U.S. patent application Ser. No. 16/600,492, filed on Oct. 12, 2019, entitled "Controlling Direction of LIDAR Output Signals," and incorporated herein in its entirety.

Figure 10A:
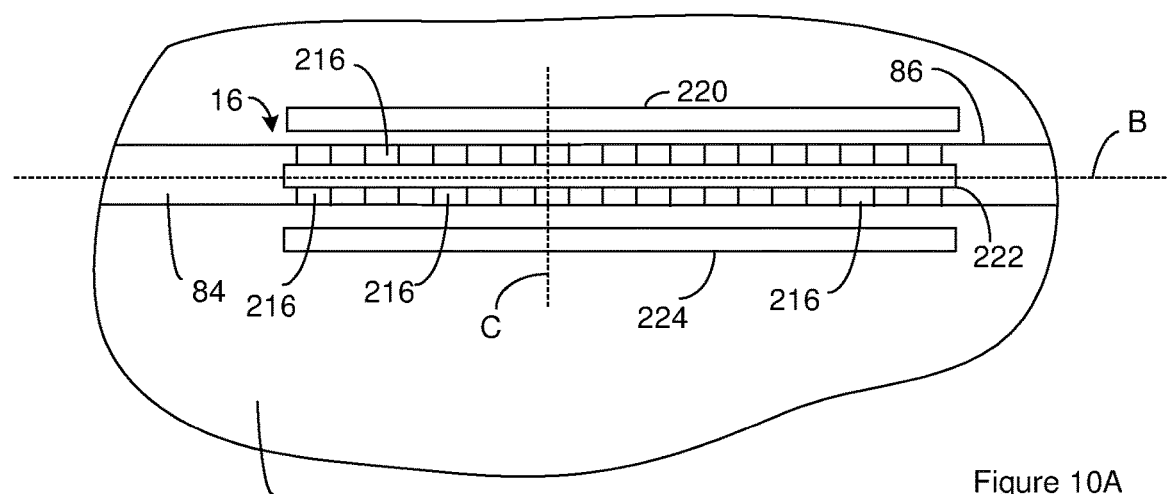
FIG. 10A through FIG. 10C illustrate a LIDAR chip where a portion of a laser cavity includes a heater configured to tune the wavelength of the outgoing LIDAR signal.
Figure 10B:
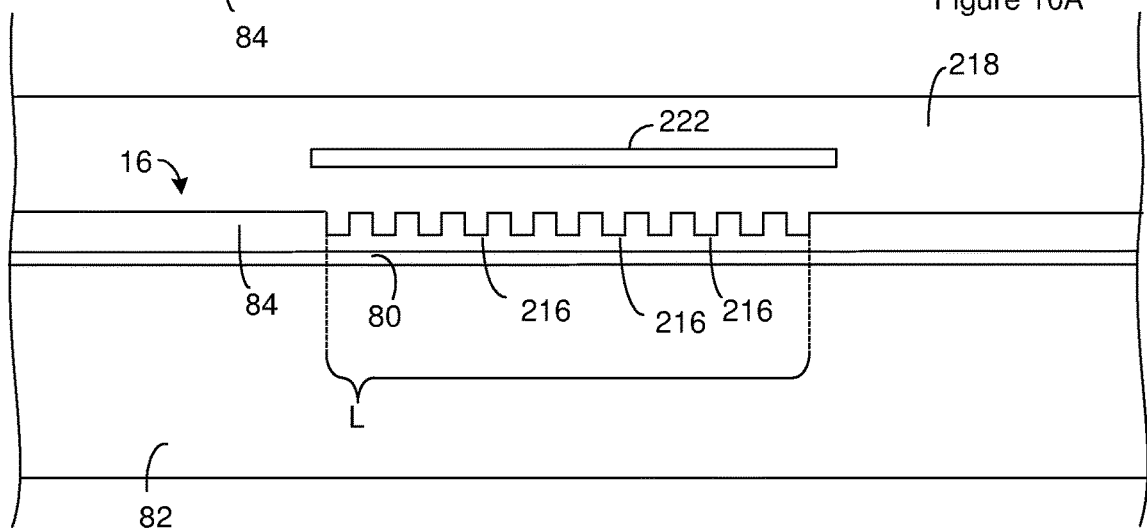
Figure 10C:
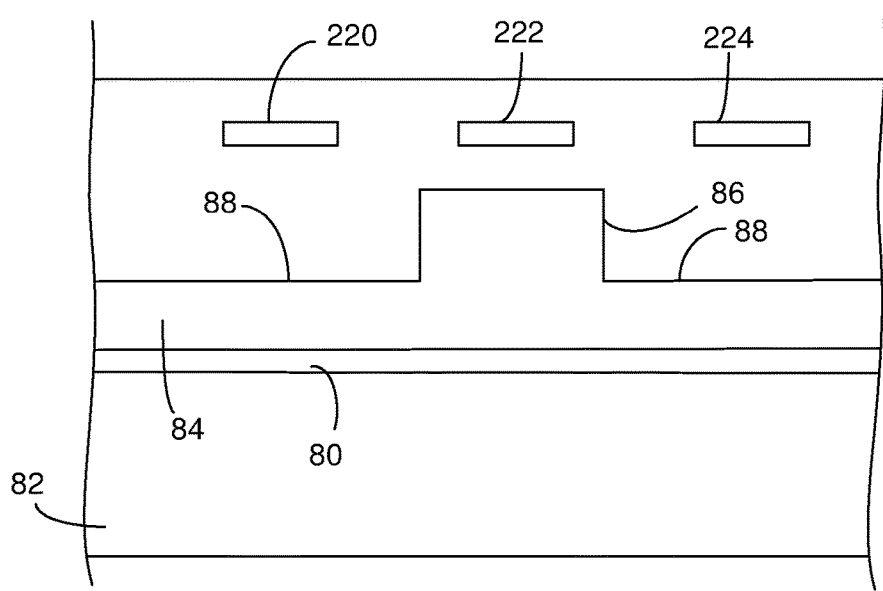

FIG. 10A through FIG. 10C illustrate a LIDAR chip where a portion of a laser cavity includes a heater configured to tune the wavelength of the outgoing LIDAR signal. FIG. 10A is a topview of the LIDAR chip. FIG. 10B is a cross section of the LIDAR chip taken along the line labeled B in FIG. 10A. FIG. 10C is a cross section of the LIDAR chip taken along the line labeled C in FIG. 10A. The illustrated portion of the laser cavity includes a heater configured to change the temperature of a partial return device such as the partial return device of FIG. 1A. The illustrated partial return device is a Bragg reflector that is defined by grooves 216 extending into the top of the ridge of the utility waveguide 16. Other Bragg reflector constructions can be used. For instance, a Bragg reflector can be defined by grooves extending into the lateral sides of the ridge of the utility waveguide 16 and/or the top of the ridge of the utility waveguide 16.

The heater includes multiple spaced apart heating elements that are in electrical communication with one another. For instance, the illustrated heater includes a first heating element 220 positioned over a region of the chip that is adjacent to the partial return device 14, a second heating element 222 positioned over the partial return device 14, and a third heating element 224 positioned over a region of the chip that is adjacent to the partial return device 14. More specifically, the first heating element 220 is positioned over a slab region 88 of the light-transmitting medium, the second heating element 222 is positioned over the utility waveguide and/or over a ridge 86 of the light-transmitting medium, and the third heating element 224 positioned over a slab region 88 of the light-transmitting medium. The second heating element 222 is positioned over the ridge 86 in that a line perpendicular to the top of the ridge can pass through the ridge and the second heating element 222.

The second heating element 222 is positioned over the utility waveguide 16 such that the longitudinal axis of the second heating elements 222 is parallel with the longitudinal axis of the utility waveguide 16. Additionally, the second heating element 222 is centered over the utility waveguide 16. For instance, the centroid of the second heating elements 222 is vertically aligned with the centroid of the utility waveguide 16. The first heating elements 220, the second heating elements 222, and the third heating elements 224 are parallel to one another and are positioned such that a line that is perpendicular to the longitudinal axis of one of the heating elements can pass through the other heating elements for at least 80% of the length of the second heating elements 222.

In some instances, the heater has one, two, or three conditions selected from the group consisting of the second heating element 222 being positioned between the first heating element 220 and the third heating element 224, the first heating element 220 not being positioned over the partial return device 14 and/or the utility waveguide 16, and the third heating element 224 not being positioned over the partial return device 14 and/or the utility waveguide 16. FIG. 10A and FIG. 10B illustrate the second heating element 222 being positioned between the first heating element 220 and the third heating element 224, the first heating element 220 not positioned over either the partial return device 14 or the utility waveguide 16, and the third heating element 224 not positioned over either the partial return device 14 or the utility waveguide 16.

The partial return device 14 has a length labeled L in FIG. 10B. The second heating element 222 can be positioned over all or a portion of the length of the partial return device. In some instances, the second heating element 222 is positioned over at least 100% f the length of the partial return device. In one example, the heater is positioned over the partial return device for 100% of the length of the partial return device and does not substantially extend beyond the length of the partial return device.

The heating elements in FIG. 10A through FIG. 10C are shown positioned in a cladding 218. The cladding 218 can act as a waveguide cladding for the utility waveguide 16. For instance, the cladding 218 can have a lower index of refraction than the light-transmitting medium 84. Additionally, the cladding 218 can be thermally conductive to permit the flow of thermal energy from the heater to the utility waveguide and accordingly to the partial return device 14.

Figure 11A:
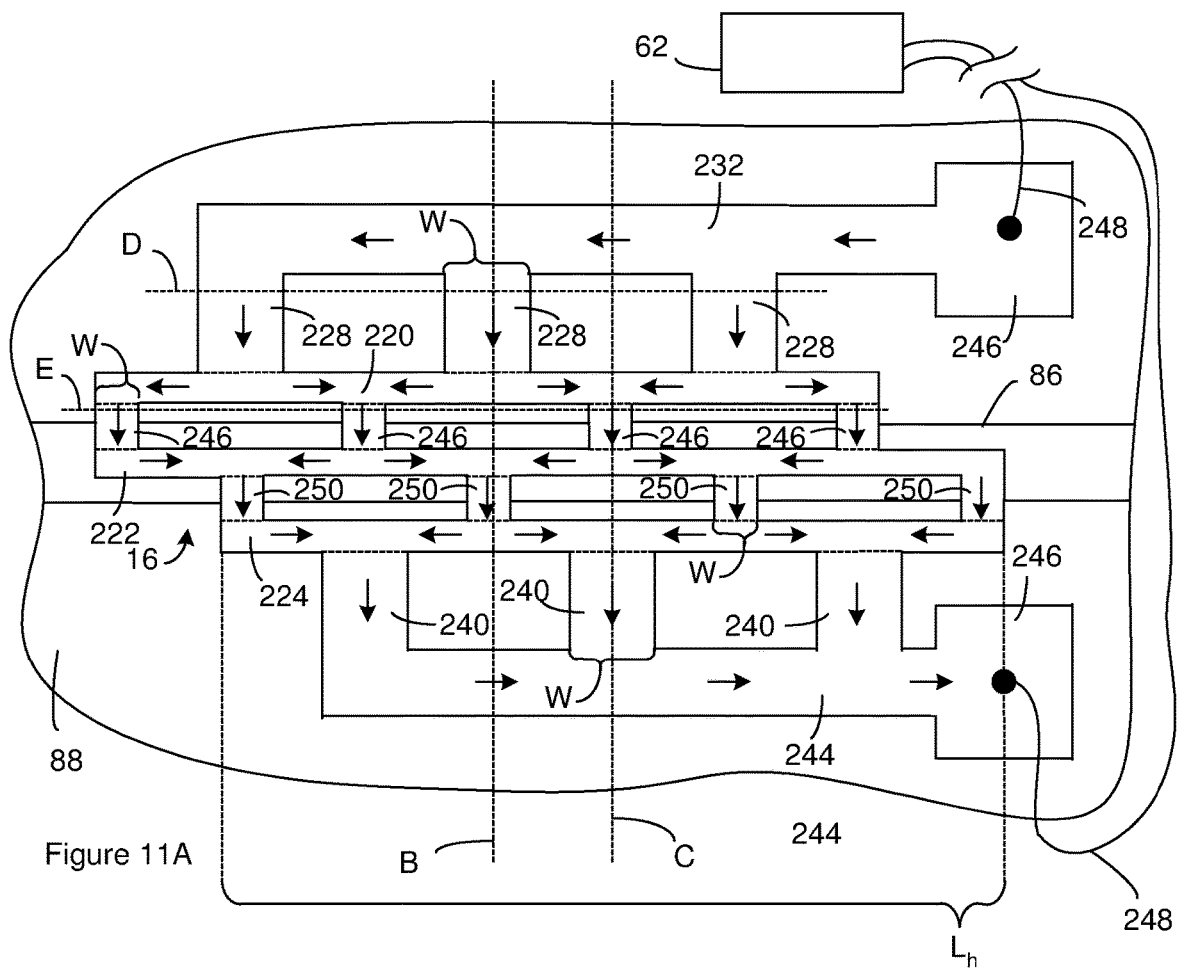
FIG. 11A through FIG. 11C illustrate the electrical connections between the different components in the heater of FIG. 10A through FIG. 10C.
Figure 11B:
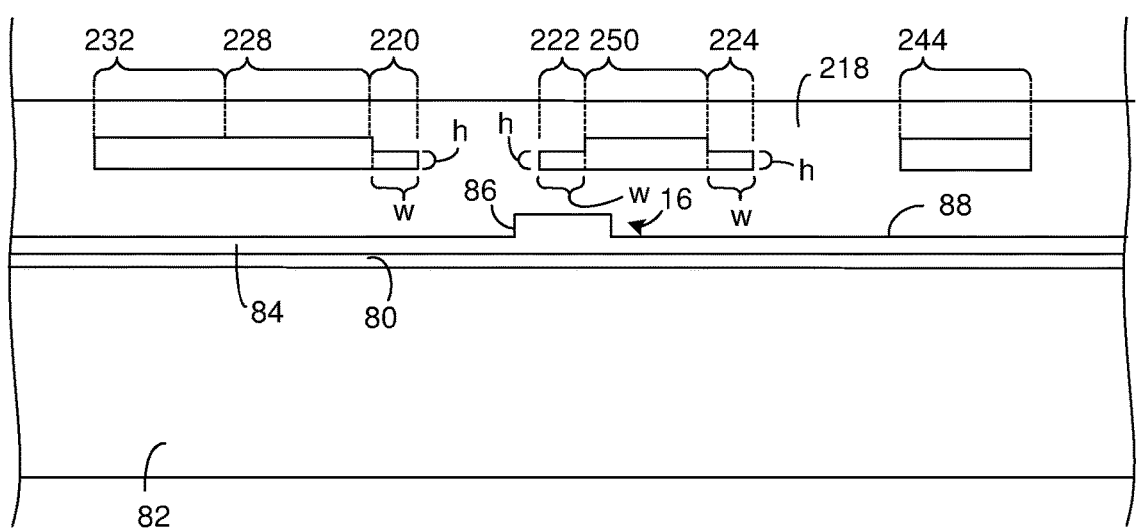
Figure 11C:
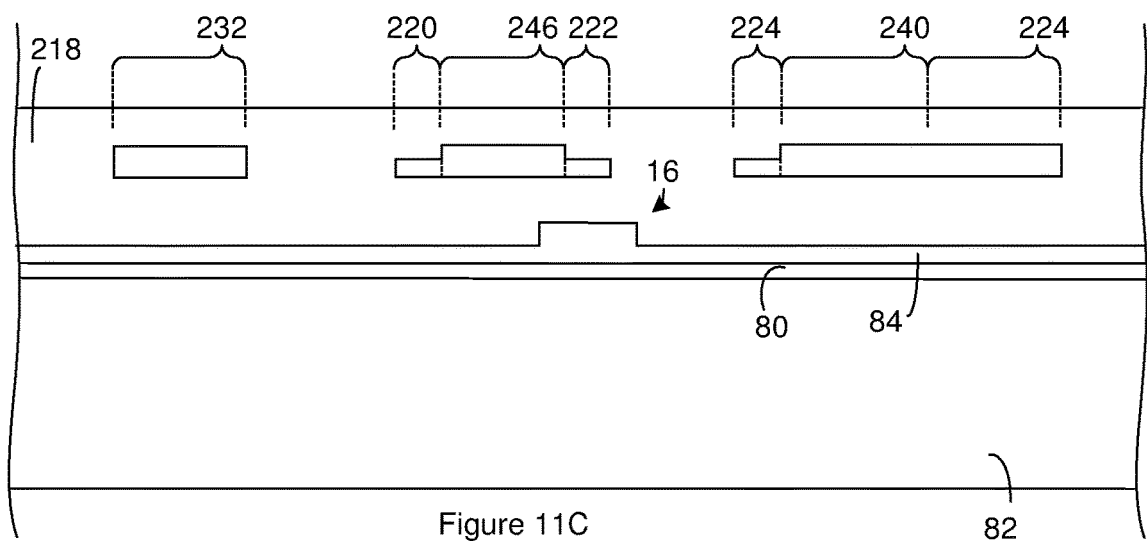

The heater includes electrical connections that are not shown in FIG. 10A through FIG. 10C in order to simplify the illustrations. FIG. 11A through FIG. 11C illustrate the electrical connections between the different components in the heater of FIG. 10A through FIG. 10C; however, the partial return device 14 is not illustrated in FIG. 11A through FIG. 11C in order to simplify the illustration. Although the partial return device 14 is not illustrated in FIG. 11A through FIG. 11C, the relationship between the components in the heater and the partial return device 14 can be the relationship disclosed in the context of FIG. 10A through FIG. 10C. FIG. 11A is a topview of the LIDAR chip. FIG. 11B is a cross section of the LIDAR chip taken along the line labeled B in FIG. 11A. FIG. 11C is a cross section of the LIDAR chip taken along the line labeled C in FIG. 11A.

The first heating element 220 and the third heating element 224 can serve as exterior heaters that are in electrical communication with the electronics 62 and with another one of the heating elements. The second heating element 222 can serve as an interior heater that is in electrical communication with multiple other heating elements.

The heater includes multiple exterior electrical connectors that are each included in an exterior electrical pathway between the electronics 62 and one of the external heating elements. The exterior electrical connectors are connected in parallel and provide electrical communication between the electronics 62 and one of the external heating elements. For instance, the illustrated heater includes first exterior connectors 228 that are each connected to the first heating element 220 and are also connected in parallel by a first connector 232 and the first heating element 220. Accordingly, the first exterior connectors 228 provide parallel electrical pathways between the first connector 232 and the first heating element 220. The heater also includes second exterior connectors 240 that are each connected to the third heating element 224 and are also connected in parallel by a second connector 244 and the third heating element 224. Accordingly, the second exterior connectors 240 provide parallel electrical pathways between the second connector 244 and the third heating element 224.

The heater includes multiple interior electrical connectors that are each included in an interior electrical pathway between heating elements. For instance, the interior electrical connectors can be included in an interior electrical pathway between an interior heating element and an exterior heating element. The illustrated heater includes first interior connectors 246 that are each connected to the first heating element 220 and to the second heating element 222. The first interior connectors 246 are also connected in parallel by the first heating element 220 and the second heating element 222. As a result, the first interior connectors 246 provide parallel electrical pathways between the first heating element 220 and the second heating element 222. The illustrated heater also includes second interior connectors 250 that are each connected to the second heating element 222 and to the third heating element 224. The second interior connectors 250 are also connected in parallel by the second heating element 222 and the third heating element 224. As a result, the second interior connectors 250 provide parallel electrical pathways between the second heating element 222 and the third heating element 224.

The first connector 232 and the second connector 244 are each in electrical communication with a contact pad 246. The contact pads can be attached to electrical conductors 248 that provide electrical communication between the contact pads 246 and the electronics 62. As a result, the electronics can apply an electrical bias across the heater so as to drive an electrical current through the heater. The arrows shown in FIG. 11A illustrate an example of the direction of the electrical current propagation through the heating elements and the associated connectors when the bias electrical current in one direction between the contact pads 246. The electrical current can be driven between the contact pads 246 in the opposite direction from the illustrated direction. The directions of current propagation through the heating elements are primarily parallel to the longitudinal axes of the heating elements.

The cladding is not shown in the topview of FIG. 11A in order to simplify the illustration. However, recesses (not shown) can extend through the cladding 218 to the contact pads 246 to permit the electrical conductors 248 to be attached to the contact pads 246. Suitable methods for attaching electrical conductors 248 to the contact pads 246 include, but are not limited to, wire bonding.

The heating elements can each be a resistive heater. As a result, the flow of electrical current through the heating elements causes the heating elements to output the thermal energy that is received by the waveguide and accordingly by the partial return device 14. The exterior heating elements are positioned such that the thermal field generated by the exterior heating elements can interact with the thermal field generated by the interior heating element. As a result, the thermal field generated by the exterior heating elements can reduce the temperature drop that occurs as the thermal field generated by the interior heating elements dissipates. Accordingly, the exterior heating elements can reduce temperature gradients within the waveguide.

Figure 12A:
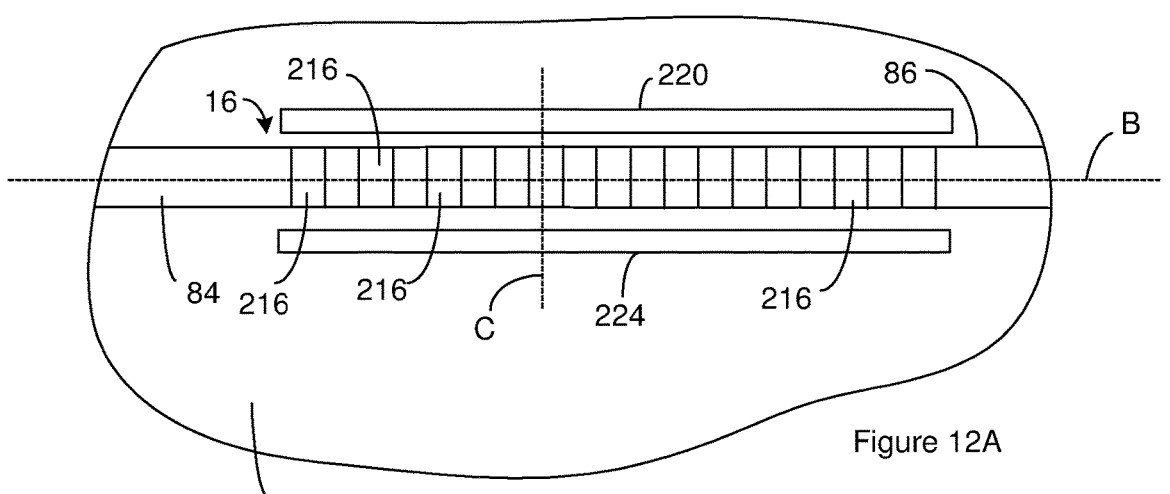
FIG. 12A through FIG. 12C illustrate a LIDAR chip with a heater configured to tune the wavelength of the outgoing LIDAR signal.
Figure 12B:
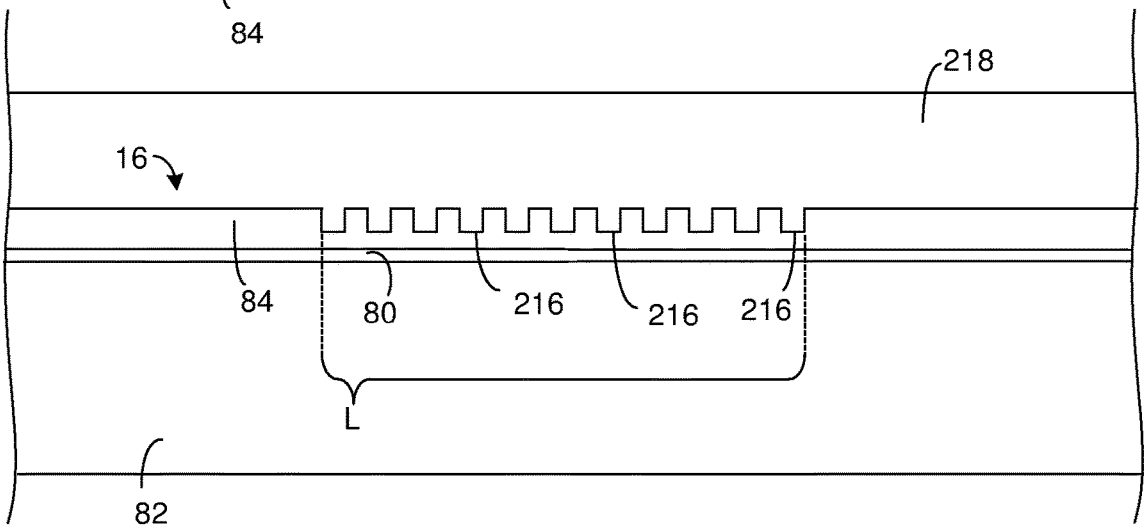
Figure 12C:
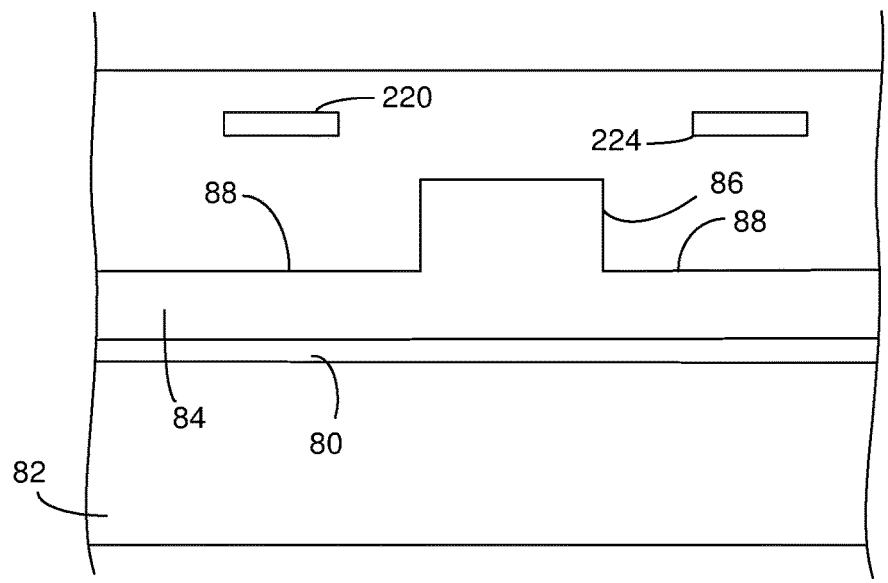

The heater can exclude an interior heating element and/or a heating element positioned over the waveguide. For instance, FIG. 12A through FIG. 12C illustrate a LIDAR chip where the heater is configured to tune the wavelength of the outgoing LIDAR signal but excludes an interior heating element and a heating element positioned over the waveguide. FIG. 12A is a topview of the LIDAR chip. FIG. 12B is a cross section of the LIDAR chip taken along the line labeled B in FIG. 12A. FIG. 12C is a cross section of the LIDAR chip taken along the line labeled C in FIG. 12A. The illustrated portion of the LIDAR chip has a portion of the laser cavity that includes a heater. The heater is configured to change the temperature of a partial return device 14. The illustrated partial return device 14 is a Bragg reflector that is defined by grooves 216 extending into the top of the ridge of the utility waveguide 16. Other Bragg reflector constructions can be used.

The heater includes multiple spaced apart heating elements that are in electrical communication with one another. For instance, the illustrated heater includes a first heating element 220 positioned over a region of the chip that is adjacent to the partial return device 14 and a third heating element 224 positioned over a region of the chip that is adjacent to the partial return device 14. More specifically, the first heating element 220 is positioned over a slab region 88 of the light-transmitting medium and the third heating element 224 positioned over a slab region 88 of the light-transmitting medium.

In some instances, the heater has one or two conditions selected from the group consisting of the first heating element 220 not being positioned over the partial return device 14 and/or the utility waveguide 16 and the third heating element 224 not being positioned over the partial return device 14 and/or the utility waveguide 16. FIG. 12A through FIG. 12C illustrate the first heating element 220 not positioned over either the partial return device 14 or the utility waveguide 16 and the third heating element 224 not positioned over either the partial return device 14 or the utility waveguide 16.

The partial return device 14 has a length labeled L in FIG. 12B. The heater can be positioned adjacent to all or a portion of the length of the partial return device. FIG. 12A illustrates the heater positioned adjacent to the utility waveguide for a distance that is more than 100% of the length of the partial return device 14. As is evident from FIG. 12A, the ends of the heater can extend beyond the ends of the return device 14. In some instances, the heater is positioned adjacent to the utility waveguide for a distance that is at least 100% of the length of the partial return device. In one example, the heater is positioned adjacent to the utility waveguide for 100% of the length of the partial return device and does not substantially extend beyond the length of the partial return device.

Figure 13A:
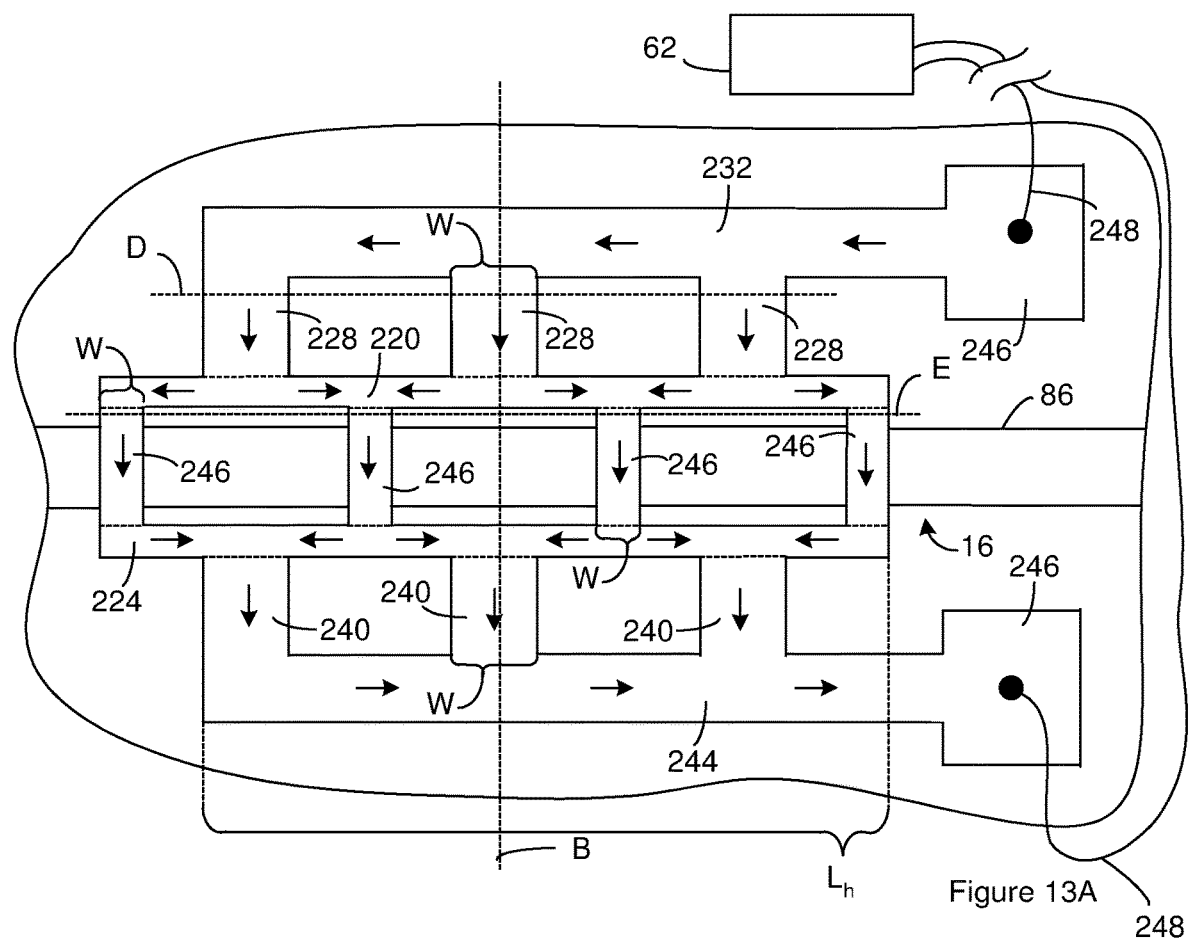
FIG. 13A through FIG. 13B illustrate electrical connections between different components in the heater of FIG. 12A through FIG. 12C.
Figure 13B:
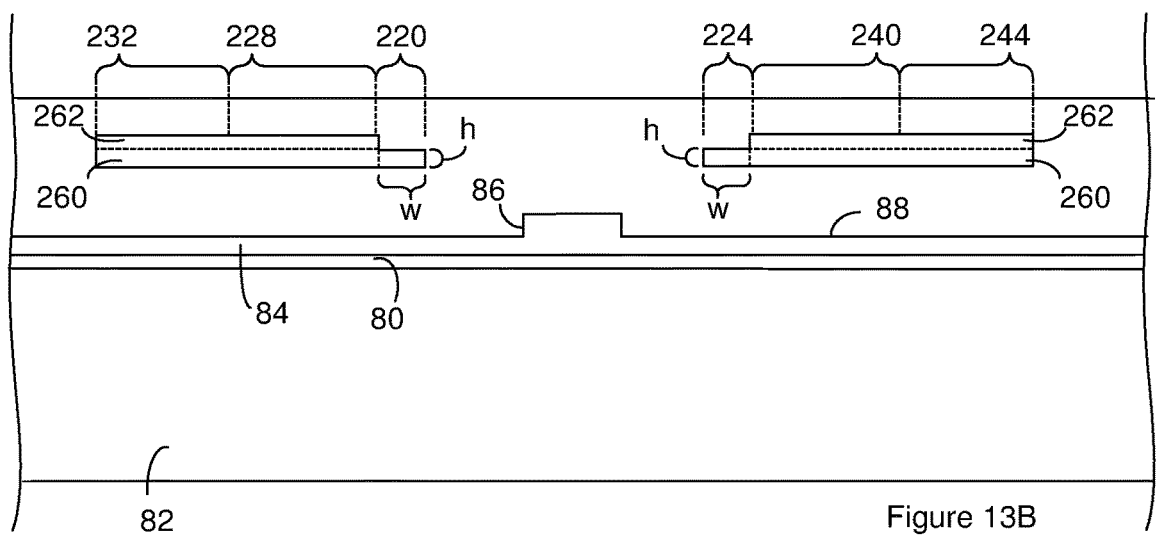

The heater includes electrical connections that are not shown in FIG. 12A through FIG. 12C in order to simplify the illustrations. FIG. 13A through FIG. 13B illustrate the electrical connections between the different components in the heater of FIG. 12A through FIG. 12C; however, the partial return device 14 is not illustrated in FIG. 13A through FIG. 13B in order to simplify the illustration. Although the partial return device 14 is not illustrated in FIG. 13A through FIG. 13B, the relationship between the components in the heater and the partial return device 14 can be the relationship disclosed in the context of FIG. 12A through FIG. 12C. FIG. 13A is a topview of the LIDAR chip. FIG. 13B is a cross section of the LIDAR chip taken along the line labeled B in FIG. 13A.

The first heating element 220 and the third heating element 224 can serve as exterior heaters that are in electrical communication with the electronics 62 and with another one of the heating elements.

The heater includes multiple exterior electrical connectors that are each included in an exterior electrical pathway between the electronics 62 and one of the external heating elements. The exterior electrical connectors are connected in parallel and provide electrical communication between the electronics 62 and one of the external heating elements. For instance, the illustrated heater includes first exterior connectors 228 that are each connected to the first heating element 220 and are also connected in parallel by a first connector 232 and the first heating element 220. Accordingly, the first exterior connectors 228 provide parallel electrical pathways between the first connector 232 and the first heating element 220. The heater also includes second exterior connectors 240 that are each connected to the third heating element 224 and are also connected in parallel by a second connector 244 and the third heating element 224. Accordingly, the second exterior connectors 240 provide parallel electrical pathways between the second connector 244 and the third heating element 224.

The heater includes multiple interior electrical connectors that are each included in an interior electrical pathway between heating elements. For instance, the interior electrical connectors can be included in an interior electrical pathway between an interior heating element and an exterior heating element. The illustrated heater includes first interior connectors 246 that are each connected to the first heating element 220 and to the third heating element 224. The first interior connectors 246 are also connected in parallel by the first heating element 220 and the third heating element 224. As a result, the first interior connectors 246 provide parallel electrical pathways between the first heating element 220 and the third heating element 224.

The first connector 232 and the second connector 244 are each in electrical communication with a contact pad 246. The contact pads can be attached to electrical conductors 248 that provide electrical communication between the contact pads 246 and the electronics 62. As a result, the electronics can apply an electrical bias across the heater so as to drive an electrical current through the heater. The arrows shown in FIG. 13A illustrate an example of the direction of the electrical current propagation through the heating elements and the associated connectors when the bias electrical current in one direction between the contact pads 246. The electrical current can be driven between the contact pads 246 in the opposite direction from the illustrated direction.

The cladding is not shown in the topview of FIG. 13A in order to simplify the illustration. However, recesses (not shown) can extend through the cladding 218 to the contact pads 246 to permit the electrical conductors 248 to be attached to the contact pads 246. Suitable methods for attaching electrical conductors 248 to the contact pads 246 include, but are not limited to, wire bonding.

The heating elements can each be a resistive heater. As a result, the flow of electrical current through the heating elements causes the heating elements to output the thermal energy that is received by the utility waveguide 16 and accordingly by the partial return device 14. The exterior heating elements are positioned such that the thermal field generated by the exterior heating elements can interact with one another and can overlap within the waveguide so as to reduce temperature gradients within the waveguide.

The heating elements have transverse cross sections that are perpendicular to the direction of propagation of the electrical current through the heating element. Additionally, the connectors have transverse cross sections that are perpendicular to the direction of propagation of the electrical current through the connector. The transverse cross sectional area for all or a portion of the connectors can be larger than the transverse cross sectional area for all or a portion of the heating elements. This arrangement reduces any heat generated by the connectors relative to the heat generated by the heating elements and accordingly increases the temperature uniformity in the utility waveguide. A suitable ratio for a transverse cross sectional area of a connector: a transverse cross sectional area of a heating element includes ratios greater than 1:1, 2:1, or 3:1 and/or less than 4:1, 6:1, or 10:1.

FIG. 11B, FIG. 11C, and FIG. 13B include examples of transverse cross sections for the heating elements. For instance, FIG. 11B and FIG. 11C each shows a transverse cross section of the first heating element 220, the second heating element 222, and third heating element 224. FIG. 13B shows a transverse cross section of the first heating element 220 and third heating element 224. Each of the heating elements has a height labeled h.

Figure 14A:
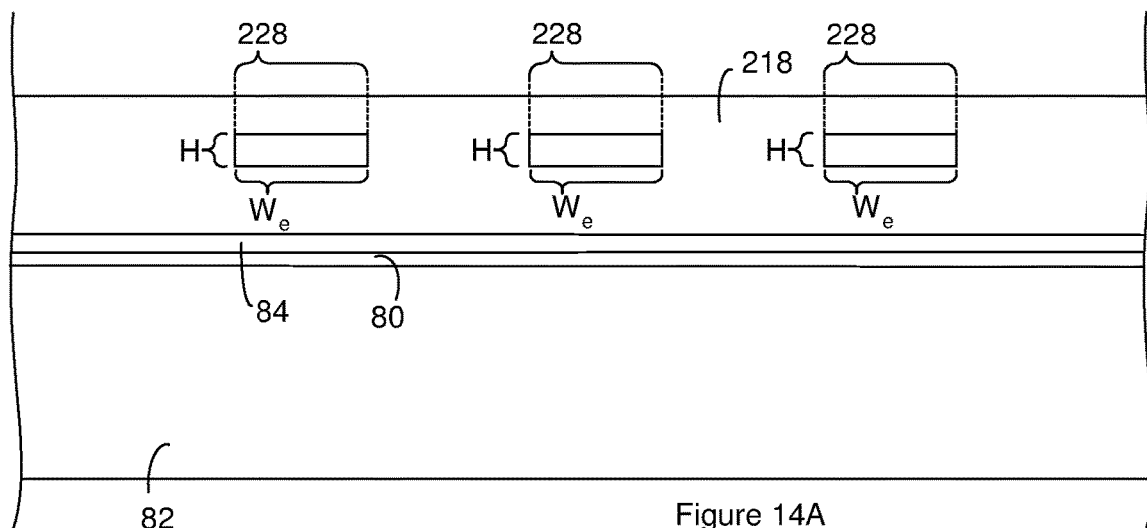
FIG. 14A and FIG. 14B include examples of transverse cross sections for connectors in a heater.
Figure 14B:
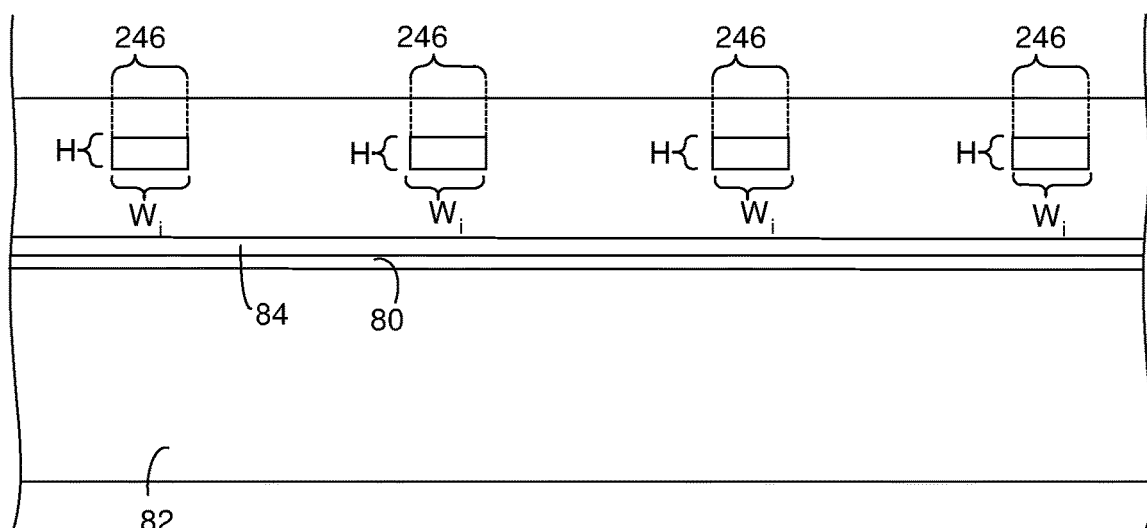

FIG. 14A and FIG. 14B include examples of transverse cross sections for connectors. FIG. 14A is a cross section of the LIDAR chip taken along the line labeled D in FIG. 11A or FIG. 13A. FIG. 14B is a cross section of the LIDAR chip taken along the line labeled E in FIG. 11A or FIG. 13A. FIG. 14A shows example transverse cross sections of exterior connectors and FIG. 14B shows example transverse cross sections of interior connectors. For instance, FIG. 14A show transverse cross sections of the first exterior connectors 228 in FIG. 11A or FIG. 13A. FIG. 14B show transverse cross sections of the first interior connectors 246 in FIG. 11A or FIG. 13A. Each of the connectors has a height labeled H.

In some instances, the heating elements each have the same height (h) or substantially the same height (h) and the connectors each have the same height (H) or substantially the same height (H). In some instances, the heating elements and connectors are each a metal trace. For instance, the heating elements and connectors can be a metal trace etched from the same metal layer. In order to increase the transverse cross sectional area of the connectors relative to the transverse cross sectional area of the heating elements, the height of the connectors can be larger than the height of the heating elements. For instance, the heating elements can each be a metal trace etched from the same metal layer and the connectors can each be a metal trace etched from a thicker metal layer.

FIG. 13B illustrates an example of a construction of the connectors and heating elements that can be used to provide the connectors with a height that is larger than the height of the heating elements. In FIG. 13B, the connectors include a base conductor 260 and an overlay conductor 262 over the base conductor 260. The heating elements include the base conductor 260 but exclude the exclude the overlay conductor 262. The base conductor and the overlay conductor can each include one or more layers of metal. In this arrangement, the overlay conductor provides the additional height of the conductors relative to the heating elements. In some instances, the overlay conductor has an electrical conductivity that is at least 1.1 times the electrical conductivity of the base conductor to provide the connectors with a higher electrical conductivity than the heating elements. In one example, the base conductor is a layer of TiN and the overlay conductor is a layer of Al. The Al has an electrical conductivity that is on the order of 4 times the electrical conductivity of the TiN. The pattern of the overlay conductor on the base conductor can be provided by etching or a lift-off process.

A suitable ratio of the height of the connectors: the heights of the heating elements includes ratios greater than 1:1, 2:1, or 5:1 and/or less than 10:1, 12:1, or 20:1. A suitable height of the heating elements includes, but is not limited to, heights greater than 100, 200, or 300 nm and/or less than 500, 1000, or 2000 nm and suitable height of the connectors is greater than 100, 200, or 500 nm and/or less than 1000, 2000, or 5000 nm.

The exterior connectors each have a width labeled $w_e$ (FIG. 14A) and the interior connectors each has a width labeled $w_i$ (FIG. 14B). The width of the exterior connectors ($w_e$) can be larger than the width of the interior connectors ($w_i$) in order to reduce voltage drop across the connector. In some instances, the widths of the exterior connectors ($w_e$) are the same or substantially the same and the widths of the interior connectors ($w_i$) are the same or substantially the same. A suitable ratio of the width of the exterior connectors ($w_e$): the widths of the interior connectors ($w_i$) includes ratios greater than 1:1, 2:1, or 3:1 and/or less than 5:1, 10:1, or 20:1. A suitable width of the exterior connectors ($w_e$) includes, but is not limited to, widths greater than 2, 4, or 6 um and/or less than 10, 15, or 20 um and a suitable width of the interior connectors ($w_i$) includes, but is not limited to, widths greater than 1, 2, or 3 um and/or less than 5, 10, or 20 um.

The width of the heating elements is labeled w. The width of the exterior connectors ($w_e$) and the width of the interior connectors ($w_i$) can be greater than the width of the heating elements (w) in order to encourage heat generation in the heating elements rather than the connectors. A suitable ratio of the width of the interior connectors ($w_i$): the widths of the heating element (w) includes ratios greater than 1:1, 1.5:1, or 2:1 and/or less than 3:1, 5:1, or 10:1. Suitable widths for the heating elements include, but are not limited to, widths greater than 1, 2, or 3 um and/or less than 5, 10, or 20 um.

FIG. 11A illustrates the 3 exterior connectors connected to each of the exterior heating elements. However, the number of exterior connectors connected to each of the exterior heating elements can be scaled down to 2 or increased above 3 to N. FIG. 11A illustrates the 3 exterior connectors connected to each of the exterior heating elements. However, the number of exterior connectors connected to each of the exterior heating elements can be scaled down to 1 or 2 or increased above 3 to N. Additionally, FIG. 11A illustrates the 3 exterior connectors connected to each of the exterior heating elements. However, the number of exterior connectors connected to each of the exterior heating elements can be scaled down to 1 or 2 or increased above 3 to N. The location where each of the N exterior connectors is connected to an exterior heating element can be periodically spaced along the length of the exterior heating element. For instance, the distance between the locations where the exterior connectors contacts the heating element can be the same for all or a portion of the each pair of adjacent exterior connectors.

The heater has a length labeled Ln in FIG. 11A and FIG. 13A. Increasing the number of exterior connectors/length of the heater ($N/L_h$) can increase the uniformity of the heat applied to the waveguide and can reduce the energy requirements of the heater. Suitable number of exterior connectors/length of the heater (N/$L_h$) include but are not limited to, N/$L_h$ values greater than 10, 20, or 40 and/or less than 100, 200, or 500.

An exterior heating element can be connected to N exterior connectors and N+1 interior connectors as shown in FIG. 11A and FIG. 13A. In some instances, the locations where each of the N+1 interior connectors is connected to an exterior heating element are periodically spaced along the length of the exterior heating element. For instance, the distance between the locations where N+1 of the interior connectors contact an exterior heating element can be the same for each adjacent pair interior connectors. Each of the N exterior connectors exterior connectors is equidistant from two interior connectors in order to reduce hot spots in the heater.

An interior heating element can be connected to N+1 first interior connectors and N+1 second interior connectors as illustrated by the second heating element 222 of FIG. 11A. In some instances, N of the N+1 first interior connectors are equidistant from two of the second interior connectors in order to reduce hot spots in the heater. In some instances, the locations where each of the N+1 first interior connectors are periodically spaced along the length of the interior heating element. For instance, the distance between the locations where the first interior connectors contact the interior heating element can be the same for all or a portion of the adjacent pairs of first interior connectors. In some instances, N of the N+1 second interior connectors are equidistant from two of the first interior connectors. As a result, a portion of the first interior connectors can be equidistant from two of the second interior connectors. Additionally or alternately, the locations where each of the N+1 second interior connectors is connected to an interior heating element are periodically spaced along the length of the interior heating element. For instance, the distance between the locations where the second interior connectors contact the interior heating element can be the same for all or a portion of the adjacent pairs of second interior connectors.

Although the heater is disclosed in the context of LIDAR systems, the heater can be used in other applications such as wavelength set and forget for laser sources in transceivers, phase tuning of lasers, and phase tuning of interferometers. Although the heater is disclosed as being used to heat a component of a laser cavity, the heater can be outside of a laser cavity. Although the heater is disclosed as being used to heat a ridge waveguide, the heater can be used to heat other waveguide structures.

Suitable electronics can include, but are not limited to, a controller that includes or consists of analog electrical circuits, digital electrical circuits, processors, microprocessors, digital signal processors (DSPs), Field Programmable Gate Arrays (FPGAs), computers, microcomputers, or combinations suitable for performing the operation, monitoring and control functions described above. In some instances, the controller has access to a memory that includes instructions to be executed by the controller during performance of the operation, control and monitoring functions. Although the electronics are illustrated as a single component in a single location, the electronics can include multiple different components that are independent of one another and/or placed in different locations. Additionally, as noted above, all or a portion of the disclosed electronics can be included on the chip including electronics that are integrated with the chip.

The chip can include components in addition to the illustrated components. As one example, optical attenuators (not illustrated) can be positioned along the first detector waveguide 36 and the second detector waveguide 38. The electronics can operate these attenuators so the power of the first portion of the composite sample signal that reaches the first light sensor 40 is the same or about the same as the power of the second portion of the composite sample signal that reaches the second light sensor 42. The electronics can operate the attenuators in response to output from the first light sensor 40 which indicates the power level of the first portion of the composite sample signal and the second light sensor 42 which indicates the power level of the second portion of the composite sample signal.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A waveguide heating system, comprising:
an optical waveguide; and
a heater configured to heat the waveguide, the heater including multiple heating elements,
the heater having one or two conditions selected from a group consisting of a first condition and a second condition,
the first condition being the heater including multiple interior connectors that are each included in an electrical pathway between a pair of the heating elements, the interior connectors being connected in parallel and providing electrical communication between the heating elements included in the pair, and
the second condition being multiple exterior connectors that are each included in an electrical pathway between electronics and a first one of the heating elements, the exterior connectors being connected in parallel and providing electrical communication between the electronics and the first heating element, and the electronics being configured to apply an electrical bias to the heater.

2. The system claim 1, wherein the heater has the first condition.

3. The system of claim 2, wherein the heating elements in the pair connect the interior connectors in parallel.

4. The system of claim 2, wherein one of the heating elements in the pair is positioned over the waveguide.

5. The system of claim 4, wherein the heating element positioned over the waveguide has a longitudinal axis that is parallel to the waveguide.

6. The system of claim 4, wherein one of the heating elements in the pair is not positioned over the waveguide.

7. The system of claim 2, wherein the interior connectors and the heating elements are each a metal trace on an integrated circuit chip,
the metal traces for the heating elements included in the pair of heating elements have an element cross section taken perpendicular to a direction of propagation of electrical current through the heating elements included in the pair of heating elements, and
the element cross sections are smaller than a cross section of the interior connectors taken perpendicular to a direction of propagation of electrical current through the interior connectors.

8. The system of claim 2, wherein the interior connectors and the heating elements are each a metal trace on an integrated circuit chip, the metal traces for the heating elements included in the pair of heating elements have an element cross section taken perpendicular to a direction of propagation of electrical current through the heating elements included in the pair of heating elements, a height of the metal traces for the heating elements included in the pair of heating elements is smaller than a height of the metal traces for the interior connectors.

9. The system of claim 2, wherein the heating elements are electrically resistive heating elements.

10. The system of claim 2, wherein the heater is positioned such that application of heat to the waveguide from the heater changes the wavelength of a light signal output from a laser cavity.

11. The system of claim 2, wherein the waveguide includes a Bragg reflector and at least one of the heating elements in the pair of heating elements is positioned over the Bragg reflector so as to apply heat to the Bragg reflector.

12. The system of claim 2, wherein the heater has the second condition.

13. The system of claim 12, wherein the first heating element is included in the pair of heating elements.

14. The system of claim 12, wherein a cross section of the external connectors taken perpendicular to a direction of propagation of electrical current through the external connector is larger than a cross section of the interior connectors taken perpendicular to a direction of propagation of electrical current through the interior connectors.

15. The system of claim 14, wherein the external connectors and the interior connectors are each a metal trace on an integrated circuit chip, the metal traces for the external connectors and the metal traces for the interior connectors each having the same thickness, and the metal traces for the external connectors being wider than the metal traces for the interior connectors.

16. The system of claim 1, wherein the external connectors and the heating elements are each a metal trace on an integrated circuit chip, the metal traces for the heating elements have an element cross section taken perpendicular to a direction of propagation of electrical current through the heating elements included in the pair of heating elements, and a height of the metal traces for the heating elements is smaller than a height of the metal traces for the external connectors.

17. The system of claim 16, wherein a cross section of the external connectors taken perpendicular to a direction of propagation of electrical current through the external connector is larger than a cross section of the heating elements taken perpendicular to a direction of propagation of electrical current through the heating elements.

18. A LIDAR system, comprising:

a heater configured to apply heat to a waveguide, the heater having multiple different heating elements in electrical communication with one another, the heater having one or two conditions selected from a group consisting of a first condition and a second condition, the first condition being the heater including multiple interior connectors that are each included in an electrical pathway between a pair of the heating elements, the interior connectors being connected in parallel and providing electrical communication between the heating elements included in the pair, and the second condition being multiple exterior connectors that are each included in a pathway between electronics and a first one of the heating elements, the exterior connectors being connected in parallel and providing electrical communication between the electronics and the first heating element, and the electronics being configured to apply an electrical bias to the heater.

19. The LIDAR system of claim 18, wherein the waveguide is included in a laser cavity and the heater is positioned such that changes in a level of heat applied to the waveguide by the heater shifts a wavelength of light output by the laser cavity.

20. The LIDAR system of claim 19, wherein a direction that a LIDAR output signal output from the LIDAR system travels away from the LIDAR system changes in response to the shift in wavelength.

* * * * *